US011405051B2

(12) United States Patent
McBride et al.

(10) Patent No.: US 11,405,051 B2
(45) Date of Patent: Aug. 2, 2022

(54) ENHANCING PROCESSING PERFORMANCE OF ARTIFICIAL INTELLIGENCE/MACHINE HARDWARE BY DATA SHARING AND DISTRIBUTION AS WELL AS REUSE OF DATA IN NEURON BUFFER/LINE BUFFER

(71) Applicant: Microsoft Technology Licensing, LLC, Redmond, WA (US)

(72) Inventors: Chad Balling McBride, North Bend, WA (US); Amol Ashok Ambardekar, Redmond, WA (US); Kent D. Cedola, Bellevue, WA (US); Boris Bobrov, Kirkland, WA (US); George Petre, Redmond, WA (US); Larry Marvin Wall, Seattle, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 1139 days.

(21) Appl. No.: 15/953,388

(22) Filed: Apr. 13, 2018

(65) Prior Publication Data
US 2018/0300617 A1    Oct. 18, 2018

Related U.S. Application Data

(60) Provisional application No. 62/486,432, filed on Apr. 17, 2017.

(51) Int. Cl.
*G06F 12/02* (2006.01)
*H03M 7/30* (2006.01)
(Continued)

(52) U.S. Cl.
CPC .......... *H03M 7/3059* (2013.01); *G06F 1/324* (2013.01); *G06F 1/3275* (2013.01);
(Continued)

(58) Field of Classification Search
None
See application file for complete search history.

(56) References Cited

U.S. PATENT DOCUMENTS 4,298,954 A    11/1981   Bigelow et al.
5,091,864 A     2/1992   Baji et al.
(Continued)

FOREIGN PATENT DOCUMENTS

EP    0147857 A2     7/1985
EP    2945290 A2    11/2015
(Continued)

OTHER PUBLICATIONS

"Final Office Action Issued in U.S. Appl. No. 15/702,311", dated Nov. 5, 2018, 12 Pages.
(Continued)

*Primary Examiner* — Cheng Yuan Tseng
(74) *Attorney, Agent, or Firm* — Newport IP, LLC; Leonard J. Hope

(57) ABSTRACT

An exemplary artificial intelligence/machine learning hardware computing environment having an exemplary DNN module cooperating with one or more memory components can perform data sharing and distribution as well reuse of a buffer data to reduce the number of memory component read/writes thereby enhancing overall hardware performance and reducing power consumption. Illustratively, data from a cooperating memory component is read according to a selected operation of the exemplary hardware and written to corresponding other memory component for use by one or more processing elements (e.g., neurons). The data is read in such a manner to optimize the engagement of the one or more processing elements for each processing cycle as well as to reuse data previously stored in the one or more cooperating memory components. Operatively, the written
(Continued)

data is copied to a shadow memory buffer prior to being consumed by the processing elements.

22 Claims, 9 Drawing Sheets

(51) Int. Cl.

| | |
|---|---|
| *G06N 3/04* | (2006.01) |
| *G06N 3/063* | (2006.01) |
| *G06F 12/0862* | (2016.01) |
| *G06F 9/46* | (2006.01) |
| *G06F 1/324* | (2019.01) |
| *G06F 3/06* | (2006.01) |
| *G06F 9/38* | (2018.01) |
| *G06F 12/08* | (2016.01) |
| *G06F 12/10* | (2016.01) |
| *G06F 15/80* | (2006.01) |
| *G06F 17/15* | (2006.01) |
| *G06N 3/06* | (2006.01) |
| *G06N 3/08* | (2006.01) |
| *G06N 3/10* | (2006.01) |
| *H04L 45/02* | (2022.01) |
| *H04L 67/02* | (2022.01) |
| *H04L 67/1001* | (2022.01) |
| *G06F 9/30* | (2018.01) |
| *G06F 13/16* | (2006.01) |
| *G06F 1/3234* | (2019.01) |
| *G06F 13/28* | (2006.01) |
| *H03M 7/46* | (2006.01) |
| *H04L 45/50* | (2022.01) |

(52) U.S. Cl.
CPC ............ *G06F 3/0604* (2013.01); *G06F 3/067* (2013.01); *G06F 3/0631* (2013.01); *G06F 9/30087* (2013.01); *G06F 9/3836* (2013.01); *G06F 9/3887* (2013.01); *G06F 9/46* (2013.01); *G06F 12/0207* (2013.01); *G06F 12/08* (2013.01); *G06F 12/0862* (2013.01); *G06F 12/10* (2013.01); *G06F 13/1673* (2013.01); *G06F 13/1689* (2013.01); *G06F 13/28* (2013.01); *G06F 15/8007* (2013.01); *G06F 17/15* (2013.01); *G06N 3/04* (2013.01); *G06N 3/049* (2013.01); *G06N 3/0454* (2013.01); *G06N 3/06* (2013.01); *G06N 3/063* (2013.01); *G06N 3/0635* (2013.01); *G06N 3/08* (2013.01); *G06N 3/10* (2013.01); *H03M 7/6005* (2013.01); *H03M 7/6011* (2013.01); *H03M 7/70* (2013.01); *H04L 45/04* (2013.01); *H04L 67/02* (2013.01); *H04L 67/1002* (2013.01); *G06F 2209/484* (2013.01); *G06F 2209/485* (2013.01); *G06F 2212/657* (2013.01); *H03M 7/46* (2013.01); *H04L 45/50* (2013.01); *Y02D 10/00* (2018.01)

(56) References Cited

U.S. PATENT DOCUMENTS

| | | | |
|---|---|---|---|
| 5,487,153 A | 1/1996 | Hammerstrom et al. |
| 5,524,175 A | 6/1996 | Sato et al. |
| 5,644,749 A | 7/1997 | Obayashi |
| 5,859,990 A | 1/1999 | Yarch |
| 5,933,654 A | 8/1999 | Galdun et al. |
| 6,307,867 B1 | 10/2001 | Roobol et al. |
| 6,654,730 B1 | 11/2003 | Kato et al. |
| 6,785,239 B1 | 8/2004 | Tasker |
| 6,990,079 B2 | 1/2006 | Vrabel |
| 7,012,893 B2 | 3/2006 | Bahadiroglu |
| 7,020,207 B1* | 3/2006 | Tavares ................ H04N 19/139 375/E7.19 |
| 7,480,640 B1 | 1/2009 | Elad et al. |
| 7,539,608 B1 | 5/2009 | Dageville et al. |
| 7,694,084 B2 | 4/2010 | Raghavan et al. |
| 7,793,040 B2* | 9/2010 | Bittner, Jr. .......... G06F 12/0895 711/216 |
| 8,244,953 B1 | 8/2012 | Kumar |
| 8,316,194 B2* | 11/2012 | Adl-Tabatabai .... G06F 12/1027 711/E12.001 |
| 8,442,927 B2 | 5/2013 | Chakradhar et al. |
| 8,892,488 B2 | 11/2014 | Qi et al. |
| 8,966,413 B2 | 2/2015 | Shacham et al. |
| 9,015,096 B2 | 4/2015 | Hunzinger |
| 9,143,393 B1 | 9/2015 | Bird et al. |
| 9,378,044 B1 | 6/2016 | Gaurav et al. |
| 9,851,771 B2 | 12/2017 | Cooper et al. |
| 9,892,125 B1* | 2/2018 | Mostak ................... G06F 16/23 |
| 9,990,307 B1 | 6/2018 | Patel et al. |
| 10,067,710 B2* | 9/2018 | Greathouse ............... G06T 1/60 |
| 10,275,001 B2 | 4/2019 | Kam et al. |
| 2002/0133648 A1 | 9/2002 | Goudie et al. |
| 2003/0065631 A1 | 4/2003 | Mcbride |
| 2003/0120799 A1 | 6/2003 | Lahav et al. |
| 2003/0200315 A1 | 10/2003 | Goldenberg et al. |
| 2004/0187135 A1 | 9/2004 | Pronovost et al. |
| 2005/0204189 A1 | 9/2005 | Akiba |
| 2005/0216616 A1 | 9/2005 | Eldar et al. |
| 2006/0047864 A1 | 3/2006 | Brokenshire et al. |
| 2007/0145151 A1 | 6/2007 | Nakamura et al. |
| 2008/0043742 A1 | 2/2008 | Pong et al. |
| 2008/0052441 A1 | 2/2008 | Freking et al. |
| 2008/0112438 A1 | 5/2008 | Ying et al. |
| 2008/0313385 A1 | 12/2008 | Vijayakumar et al. |
| 2008/0319933 A1 | 12/2008 | Moussa et al. |
| 2009/0037697 A1 | 2/2009 | Ramani et al. |
| 2009/0313195 A1 | 12/2009 | Mcdaid et al. |
| 2010/0180100 A1 | 7/2010 | Lu et al. |
| 2010/0257174 A1 | 10/2010 | Minuti |
| 2010/0281192 A1 | 11/2010 | Rakib et al. |
| 2011/0246722 A1 | 10/2011 | Taha et al. |
| 2012/0130928 A1 | 5/2012 | Bell et al. |
| 2012/0134449 A1 | 5/2012 | Chen et al. |
| 2014/0046882 A1 | 2/2014 | Wood |
| 2014/0181464 A1 | 6/2014 | Forsyth et al. |
| 2014/0281221 A1 | 9/2014 | Wang et al. |
| 2014/0372670 A1 | 12/2014 | Vasilyuk |
| 2015/0363239 A1 | 12/2015 | Hsu et al. |
| 2016/0098388 A1 | 4/2016 | Blevins et al. |
| 2016/0184587 A1 | 6/2016 | Heuvel et al. |
| 2016/0267377 A1 | 9/2016 | Pan et al. |
| 2016/0328644 A1 | 11/2016 | Lin et al. |
| 2016/0335119 A1 | 11/2016 | Merrill et al. |
| 2016/0350653 A1 | 12/2016 | Socher et al. |
| 2017/0011288 A1 | 1/2017 | Brothers et al. |
| 2017/0199902 A1 | 7/2017 | Mishra et al. |
| 2018/0299943 A1 | 10/2018 | Mcbride et al. |
| 2018/0300601 A1 | 10/2018 | Cedola et al. |
| 2018/0300602 A1 | 10/2018 | Petre et al. |
| 2018/0300603 A1 | 10/2018 | Ambardekar et al. |
| 2018/0300604 A1 | 10/2018 | Mcbride et al. |
| 2018/0300605 A1 | 10/2018 | Ambardekar et al. |
| 2018/0300606 A1 | 10/2018 | Corkery et al. |
| 2018/0300607 A1 | 10/2018 | Petre et al. |
| 2018/0300613 A1 | 10/2018 | Petre et al. |
| 2018/0300614 A1 | 10/2018 | Ambardekar et al. |
| 2018/0300615 A1 | 10/2018 | Ambardekar et al. |
| 2018/0300616 A1 | 10/2018 | Ambardekar et al. |
| 2018/0300633 A1 | 10/2018 | Mcbride et al. |
| 2018/0300634 A1 | 10/2018 | Mcbride et al. |
| 2020/0233820 A1 | 7/2020 | Mcbride et al. |

FOREIGN PATENT DOCUMENTS

| | | |
|---|---|---|
| EP | 3035204 A1 | 6/2016 |
| EP | 3035249 A1 | 6/2016 |

(56) References Cited

FOREIGN PATENT DOCUMENTS

| WO | 1993014459 A1 | 7/1993 |
|---|---|---|
| WO | 2016118257 A1 | 7/2016 |
| WO | 2016210030 A1 | 12/2016 |

OTHER PUBLICATIONS

"International Search Report & Written Opinion Issued in PCT Patent Application No. PCT/US18/027674", dated Jul. 13, 2018, 13 Pages.

"International Search Report & Written Opinion Issued in PCT Patent Application No. PCT/US18/027680", dated Sep. 27, 2018, 13 Pages.

"International Search Report & Written Opinion Issued in PCT Patent Application No. PCT/US18/027828", dated Aug. 3, 2018, 11 Pages.

"International Search Report & Written Opinion Issued in PCT Patent Application No. PCT/US18/027834", dated Jul. 24, 2018, 11 Pages.

"International Search Report & Written Opinion Issued in PCT Patent Application No. PCT/US18/027836", dated Aug. 3, 2018, 14 Pages.

"International Search Report & Written Opinion Issued in PCT Patent Application No. PCT/US18/027837", dated Aug. 3, 2018, 10 Pages.

"International Search Report & Written Opinion Issued in PCT Patent Application No. PCT/US18/027840", dated Jul. 30, 2018, 9 Pages.

"Notice of Allowance Issued in U.S. Appl. No. 15/694,663", dated May 8, 2020, 9 Pages.

"Notice of Allowance Issued in U.S. Appl. No. 15/702,311", dated Sep. 11, 2019, 6 Pages.

"Ex Parte Quayle Action Issued in U.S. Appl. No. 15/950,644", dated Sep. 23, 2019, 7 Pages.

"Non Final Office Action Issued in U.S. Appl. No. 15/702,311", dated May 21, 2019, 12 Pages.

"Non Final Office Action Issued In U.S. Appl. No. 15/702,311", dated Jun. 29, 2018, 10 Pages.

"International Search Report and Written Opinion Issued In PCT Application No. PCT/US2018/026358", dated Jul. 11, 2018, 15 Pages.

"International Search Report and Written Opinion Issued In PCT Application No. PCT/US2018/026352", dated Jun. 27, 2018, 11 Pages.

"International Search Report and Written Opinion Issued In PCT Application No. PCT/US2018/026353", dated Jul. 6, 2018, 15 Pages.

"International Search Report and Written Opinion Issued In PCT Application No. PCT/US2018/026354", dated Jul. 31, 2018, 15 Pages.

"International Search Report and Written Opinion Issued In PCT Application No. PCT/US2018/026355", dated Jul. 9, 2018, 16 Pages.

"International Search Report and Written Opinion Issued In PCT Application No. PCT/US2018/026356", dated Jul. 6, 2018, 16 Pages.

"International Search Report and Written Opinion Issued In PCT Application No. PCT/US2018/026357", dated Jul. 9, 2018, 16 Pages.

Chi, et al., "PRIME: A Novel Processing-in-memory Architecture for Neural Network Computation in ReRAM-based Main Memory", In Proceedings of the ACM/IEEE 43rd Annual International Symposium on Computer Architecture, Jun. 18, 2016, 13 Pages.

"Office Action Issued in Indian Patent Application No. 201947036448", dated Feb. 3, 2022, 6 Pages.

"Office Action Issued in European Patent Application No. 18722339.1", dated Dec. 21, 2021, 7 Pages.

* cited by examiner

ENHANCING PROCESSING PERFORMANCE OF ARTIFICIAL INTELLIGENCE/MACHINE HARDWARE BY DATA SHARING AND DISTRIBUTION AS WELL AS REUSE OF DATA IN NEURON BUFFER/LINE BUFFER

CROSS-REFERENCE TO RELATED APPLICATIONS

This application claims priority under 35 U.S.C. § 119(e) to U.S. Provisional Patent Application No. 62/486,432, filed on Apr. 17, 2017 and titled "Enhanced Neural Network Designs," the entire disclosure of which is expressly incorporated in its entirety by reference herein.

BACKGROUND

Deep neural networks ("DNNs") as expressed through exemplary artificial intelligence/machine learning hardware environments are loosely modeled after information processing and communication patterns in biological nervous systems, such as the human brain. DNNs can be utilized to solve complex classification problems such as, but not limited to, object detection, semantic labeling, and feature extraction. As a result, DNNs form the foundation for many artificial intelligence ("AI") applications, such as computer vision, speech recognition, and machine translation. DNNs can match or exceed human accuracy in many of these domains.

The high-level of performance of DNNs stems from their ability to extract high-level features from input data after using statistical learning over a large data set to obtain an effective representation of an input space. However, the superior performance of DNNs comes at the cost of high computational complexity. High performance general-purpose processors, such as graphics processing units ("GPUs"), are commonly utilized to provide the high level of computational performance required by many DNN applications.

While general-purpose processors, like GPUs, can provide a high level of computational performance for implementing DNNs, these types of processors are typically unsuitable for use in performing DNN operations over long durations in computing devices where low power consumption is critical. For example, general-purpose processors, such as GPUs, can be unsuitable for use in performing long-running DNN tasks in battery-powered portable devices, like smartphones or alternate/virtual reality ("AR/VR") devices, where the reduced power consumption is required to extend battery life.

Reduced power consumption while performing continuous DNN tasks, such as detection of human movement, can also be important in non-battery-powered devices, such as a power-over-Ethernet ("POE") security camera for example. In this specific example, POE switches can provide only a limited amount of power, and reduced power in POE devices like security cameras results in lower power consumption and cost of POE switches Application-specific integrated circuits ("ASICs") have been developed that can provide performant DNN processing while at the same time reducing power consumption as compared to general-purpose processors. Despite advances in this area, however, there is a continued need to improve the performance and reduce the power consumption of ASICs that perform DNN processing, particularly for use in computing devices where the low power consumption is critical.

Current practices provide for various mechanisms to manage memory and/or processing to ensure a balance between requesting components for shared resources of an exemplary computing environment. With current practices, such memory/processor management falls short to optimize the number of read/write operations performed between cooperating memory elements of the DNN module as well as the overall utility of each of the available processing elements such as neurons of a cooperating DNN chip. Moreover, current practices focus on overall processing/memory management of the system without possible regard to the overall power consumption and processing performance of the artificial intelligence/machine learning hardware components.

It is with respect to these and other technical challenges that the disclosure made herein is presented.

SUMMARY

An artificial intelligence/machine learning hardware as expressed as a DNN module is disclosed that can enhance the processing performance of the module's processing units by performing optimized data sharing and distribution as well as reuse of data across various cooperating memory components of the exemplary environment as well as reducing power consumption by enhanced memory management. Other technical benefits not specifically mentioned herein can also be realized through implementations of the disclosed subject matter.

In order to realize the technical benefits mentioned briefly above, illustratively, in an exemplary computing environment having a DNN module, the DNN module can be operated to optimize data sharing and distribution as well as reuse of data across one or more cooperating memory components such as an exemplary neuron buffer and/or line buffer. Illustratively, two aspects of performance can be measured. The first component, compute, can be measured according to a number of units including but not limited to floating point operations per second (e.g. GFlops/s) and multiply adds per second (e.g., GMACs/s). The second component, data transfer, can be measured by the number of bytes transferred per second (e.g. GBytes/s). To ensure the highest performance of the exemplary DNN module, both compute and data transfer rates can be optimized and balanced. Such optimization can result in the enhancement of overall processing performance and overall decreased power consumption realized by the exemplary artificial intelligence/machine learning hardware described herein.

Data transfer, in an exemplary DNN environment can be further decomposed into two kinds of data transfer such as first instruction fetching and second algorithmic data transfer. In an illustrative implementation, exemplary NN environment algorithms can rely on one or more functions that can be decomposed into several different matrix operations such as convolution, deconvolution, multiplication, addition, and so on, to infer/learn one or more next operations from input data. Illustratively, such inference/learning can be based on some other context represented as other input data. Many of these operations are inherently parallel and can take advantage of simultaneous processing as implemented in exemplary DNN hardware.

To achieve such parallel processing at high throughput with limited bandwidth usage, the herein described systems and methods can illustratively structure input data for processing by the exemplary DNN environment in hardware such that simultaneous and near-term future use of the input data can occur without rereading the same input data from one or more cooperating memory components for each required use of the input data. In an illustrative operation, the herein described systems and methods can illustratively operate as a data buffer that can operatively store data locally and can rely on temporal and spatial locality of the data to be processed.

The herein described systems and methods operatively minimize the number of data reads from memory and maximizes the number of operations performed on that data before it leaves a cooperating memory component of a DNN environment, such as a data buffer. Operatively, common data required can be distributed amongst many consumers of the data such as neurons of an exemplary DNN environment. The herein described systems and methods also address the scalability of a cooperating memory component such as a data buffer by allowing scalability of data sharing/distribution in one or more dimensions including but not limited to: 1) across a number of cooperating data consumers (e.g., neurons) and 2) in the time window available for data sharing opportunities.

Operatively, data can be shared across the cooperating data consumers such that there is adequate step time to remove possible data retrieval miss stalls (i.e., data is not available in a cooperating memory component for consumption by a data consumer) thereby eliminating hundreds of cycles of stall waiting for returned data.

In an illustrative implementation, the function that is being performed by the cooperating data consumers can be received by an exemplary operations controller of an exemplary DNN module as part of processing exemplary input data. Operatively, the input data can then be organized to reduce the number of memory reads from one or more cooperating memory components for the given operation/s to fully execute through completion.

Illustratively, since multiple processing operations share the same input data and/or a variable configuration of the input data, bandwidth requirements can be reduced since memory reads are optimized. In the illustrative implementation the herein described systems and methods can operate on multiple copies of the data stored across one or more cooperating memory components according to a push model (e.g., a model in which the data is pre-populated in a cooperating memory component prior to being consumed by one more cooperating consumers—e.g., neurons). Illustratively, the neuron memory buffer is operative to reconfigure the data read from a cooperating local memory in a single cycle such that all X elements read from external memory are written to the intended memory location. Without such on-the-fly reconfiguration of the data, the same data would have to be read multiple times requiring additional processing time and increased power consumption.

In an illustrative implementation, a neuron buffer can be utilized that operatively provides input data to cooperating one or more neurons at a selected rate that ensures the maximum processing operation of the one or more cooperating neurons during a processing cycle. The size of the neuron buffer can be dependent on the number of neurons, the size of a data cell, and the number of cycles that the data snapshot represents. In an illustrative implementation, the exemplary neuron buffer can be comprised of four memory structures. Two of those memory structures can be allocated for exemplary operand A and two of the exemplary memory structures can be allocated for exemplary operand B. It is appreciated that although an illustrative implementation is described using two operands that the inventive concepts described herein consider the use of any number of operands. In the illustrative implementation, each operand pair can be comprised of a primary memory and a shadow memory comprising a double buffer memory component where the shadow copy represents current data consumed for processing and the primary copy represents the next data block for consumption.

In an illustrative implementation, the primary memory buffer can be deployed as a data reconfiguration memory and shadow buffer memory as an exemplary queue that can hold multiple snapshots of reconfiguration memory. By way of example, if a shadow buffer memory configuration has queue size=1, the system can operatively continuously read the data from outside memory and place it in the reconfiguration (primary) memory. Once the primary memory is filled, the primary memory elements can be copied to the next available location in the shadow memory queue, the primary data memory elements also being erased after the copy, rendering the primary memory buffer available to have new data written to it.

In an illustrative operation, the rows of the neuron buffer can be mapped to each neuron. For instance, row[0] can represent the data for neuron[0] and row[1] can represent the data for neuron[1]. The number of neurons can be referred to as N. Further, the columns of the neuron buffer can be mapped to time in terms of clock cycle. For example, column[0] is the data that the cooperating neurons will process in cycle 0 relative to the last copy of the data that resides in the exemplary shadow buffer. The number of cycles that are processed can be referred to as K.

In the illustrative operation, input data can read from the local memory and written to either or both neuron buffer A and B operand memories such that the primary buffers have enough data to operatively engage the N neurons busy for K cycles. Illustratively, on the final write to the primary buffers, the data can then be copied to the shadow registers. The control information to perform the copy-to-shadow is included with other control information that defines the read/write operation that are processed by the cooperating memory components.

In the illustrative operation, the cycle after the copy-to-shadow occurs, the neurons can operatively process the data copied to the shadow copy. Operatively, the one or more cooperating neurons can read a value from the operandA buffer and the operandB buffer. These two values are then multiplied and added to an exemplary accumulator component in the neuron.

As discussed briefly above, implementations of the technologies disclosed herein provide enhanced processing performance and reduced power consumption by the DNN module given that DNN module can optimize the bandwidth available to the cooperating processing units of the exemplary neural network environment. Other technical benefits not specifically identified herein can also be realized through implementations of the disclosed technologies.

It should be appreciated that the above-described subject matter can be implemented as a computer-controlled apparatus, a computer-implemented method, a computing device, or as an article of manufacture such as a computer readable medium. These and various other features will be apparent from a reading of the following Detailed Description and a review of the associated drawings.

This Summary is provided to introduce a brief description of some aspects of the disclosed technologies in a simplified form that are further described below in the Detailed Description. This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

DETAILED DESCRIPTION

Figure 1:
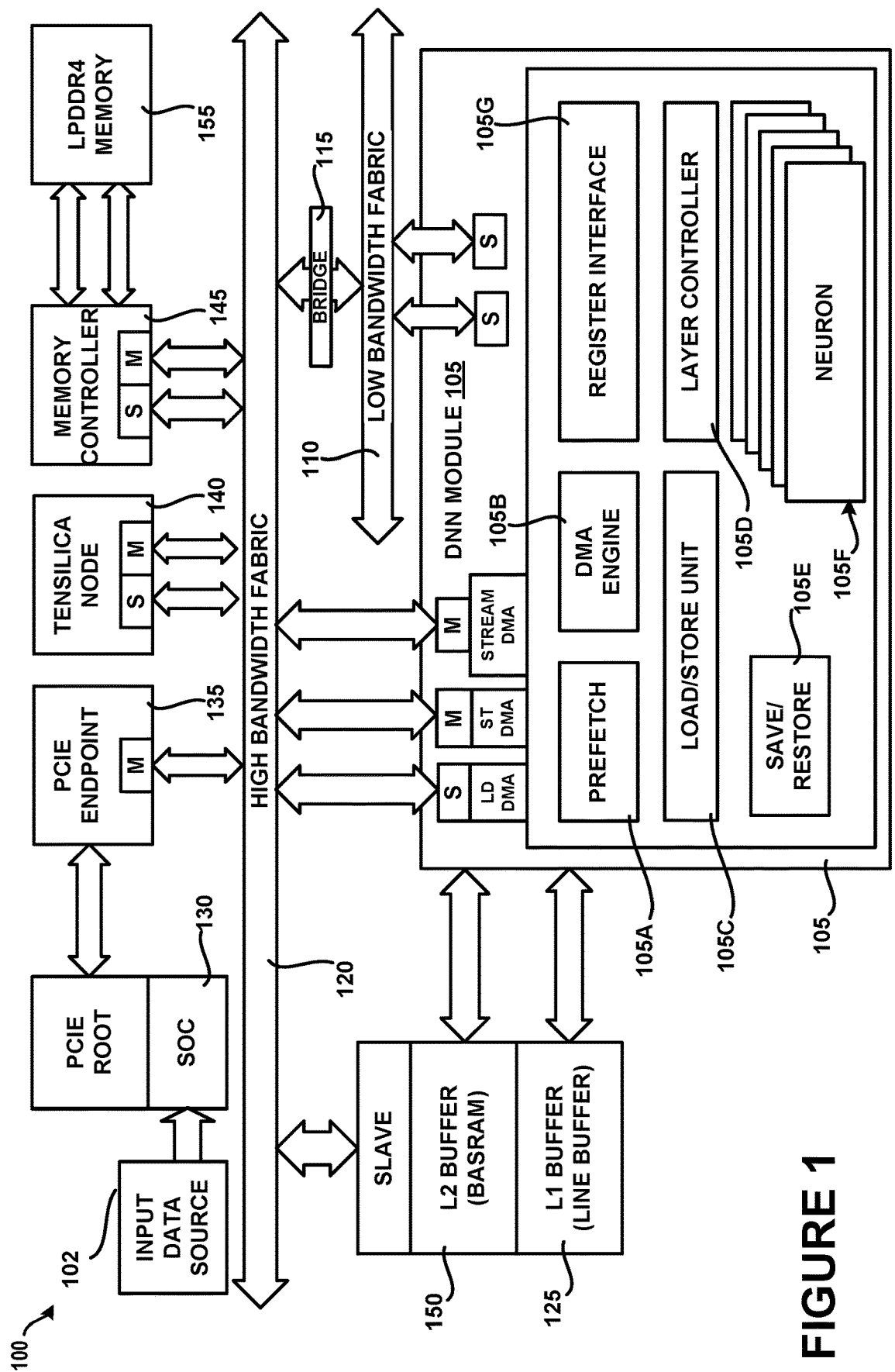
FIG. 1 is a computing architecture diagram that shows aspects of the configuration and operation of a DNN module that implements aspects of the technologies disclosed herein, according to one embodiment.

The following detailed description is directed to an artificial intelligence/machine learning hardware environment such as a neural network module that can enhance the processing performance of the module's processing units by performing optimized data sharing and distribution as well as reuse of data across various cooperating memory components of the exemplary environment as well as reducing power consumption by enhanced memory management.

As discussed briefly above, implementations of the technologies disclosed herein provide enhanced processing performance and reduced power consumption by the DNN module given that DNN module can optimize the bandwidth available to the cooperating processing units of the exemplary neural network environment. Other technical benefits not specifically mentioned herein can also be realized through implementations of the disclosed subject matter.

To realize the technical benefits mentioned briefly above, illustratively, in an exemplary computing environment having a DNN module, the DNN module can be operated to optimize data sharing and distribution as well as reuse data across one or more cooperating memory components such as an exemplary neuron buffer and/or line buffer. Illustratively, two components of performance can be measured. The first component, compute, can be measured in floating point operations per second (e.g. GFlops/s). The second component, data transfer, can be measured by the number of bytes transferred per second (e.g. GBytes/s). To ensure the highest performance of the exemplary DNN module, both compute and data transfer rates can be optimized and balanced.

Data transfer, in an exemplary DNN environment can be further decomposed into two kinds of data transfer such as first instruction fetching and second algorithmic data transfer. In an illustrative implementation, exemplary NN environment algorithms can rely on one or more functions that can be decomposed into several different matrix operations such as convolution, deconvolution, multiplication, addition, and so on, to infer/learn one or more next operations from input data. Illustratively, such inference/learning can be based on some other context represented as other input data. Many of these operations are inherently parallel and can take advantage of simultaneous processing as implemented in exemplary DNN hardware.

To achieve such parallel processing at high throughput with limited bandwidth usage, the herein described systems and methods can illustratively structure input data for processing by the exemplary DNN environment in hardware such that simultaneous and near-term future use of the input data can occur without rereading the same input data from one or more cooperating memory components for each required use of the input data. In an illustrative operation, the herein described systems and methods can illustratively operate as a data buffer that can operatively store data locally and can rely on temporal and spatial locality of the data to be processed.

The herein described systems and methods operatively minimize the number of data reads from memory and maximizes the number of operations performed on that data before it leaves a cooperating memory component of a DNN environment such as a data buffer. Operatively, common data required can be distributed amongst many consumers of the data such as neurons of an exemplary DNN environment. The herein described systems and methods also address the scalability of a cooperating memory component such as a data buffer by allowing scalability of data sharing/distribution in one or more dimensions including but not limited to: 1) across the one or more cooperating data consumers (e.g., neurons) and 2) in the time window available for data sharing opportunities.

Operatively, data can be shared across the cooperating data consumers such that there is adequate step time to remove possible data retrieval miss stalls (i.e., data is not available in a cooperating memory component for consumption by a data consumer) thereby eliminating hundreds of cycles of stall waiting for returned data.

In an illustrative implementation, the function that is being performed by the cooperating data consumers can be received by an exemplary operations controller of an exemplary DNN module as part of processing exemplary input data. Operatively, the input data can then be organized to reduce the number of memory reads from one or more cooperating memory components for the given operation to fully execute through completion. Illustratively, since multiple processing operations share the same input data, bandwidth requirements can be reduced since memory reads are optimized. In the illustrative implementation the herein described systems and methods can operate on multiple copies of the data stored across one or more cooperating memory components according to a push model (e.g., a model in which the data is pre-populated in a cooperating memory component prior to being consumed by one more cooperating consumers—e.g., neurons). Illustratively, the neuron memory buffer is operative to reconfigure the data read from a cooperating local memory in a single cycle such that all X elements read from external memory are written to the intended memory location. Without such on-the-fly reconfiguration of the data, the same data multiple would have to be read in multiple times requiring additional processing time and increased power consumption.

In an illustrative implementation, a neuron buffer can be utilized that operatively provides input data to cooperating one or more neurons at a selected rate that ensures the maximum processing operation of the one or more cooperating neurons during a processing cycle. The size of the neuron buffer can be dependent on the number of neurons, the size of a data cell, and the number of cycles that the data snapshot represents.

In an illustrative implementation, the exemplary neuron buffer can be comprised of four memory structures. Two of those memory structures can be allocated for exemplary operand A and two of the exemplary memory structures can be allocated for exemplary operand B. It is appreciated that although an illustrative implementation is described using two operands that the inventive concepts described herein consider the use of any number of operands. In the illustrative implementation, each operand pair can be comprised of a primary memory and a shadow memory comprising a double buffer memory component where the shadow copy represents current data consumed for processing and the primary copy represents the next data block for consumption.

In an illustrative operation, the rows of the neuron buffer can be mapped to each neuron. For instance, row[0] is the data for neuron[0] and row[1] is the data for neuron[1]. The number of neurons can be referred to as N. Further, the columns of the neuron buffer can be mapped to time in terms of clock cycle. For example, column[0] is the data that the cooperating neurons will process in cycle 0 relative to the last copy of the data that resides in the exemplary shadow buffer. The number of cycles that are processed can be referred to as K and is operatively configurable.

In the illustrative operation, input data can read from the local memory and written to either or both neuron buffer A and B operand memories such that the primary buffers have enough data to keep the N neurons busy for K cycles. Illustratively, on the final write to the primary buffers, the data can then be copied to the shadow registers. The control information to perform the copy-to-shadow is included with other control information that defines the read/write operation that are processed by the cooperating memory components.

In the illustrative operation, the cycle after the copy-to-shadow occurs, the neurons can operatively process the data copied to the shadow copy. Illustratively, the shadow copy memory buffer can have the same size as the primary memory buffer or be a multiple in size of the primary memory buffer so as to operate as a queue to hold N copies of the primary memory data at any given time. Operatively, the one or more cooperating neurons can read a value from the operandA buffer and the operandB buffer. These two values are then multiplied and added to an exemplary accumulator component in the neuron.

In an illustrative implementation, the primary memory buffer can be deployed as a data reconfiguration memory and shadow buffer memory as an exemplary queue that can hold multiple snapshots of reconfiguration memory. By way of example, if a shadow buffer memory configuration has queue size=1, the system can operatively continuously read the data from outside memory and place it in the reconfiguration (primary) memory. Once the primary memory is filled, the primary memory elements can be copied to the next available location in the shadow memory queue, the primary data memory elements also being erased after the copy, rendering the primary memory buffer available to have new data written to it.

While the subject matter described herein is presented in the general context of a hardware DNN module, those skilled in the art will recognize that other implementations can be performed in combination with other types of computing systems and modules, inclusive of various artificial intelligence and/or machine learning hardware components. Those skilled in the art will also appreciate that the subject matter described herein can be practiced with other computer system configurations, including hand-held devices, multiprocessor systems, microprocessor-based or programmable consumer electronics, computing or processing systems embedded in devices (such as wearable computing devices, automobiles, home automation etc.), minicomputers, mainframe computers, and the like.

In the following detailed description, references are made to the accompanying drawings that form a part hereof, and which are shown by way of illustration specific configurations or examples. Referring now to the drawings, in which like numerals represent like elements throughout the several FIGS., aspects of a exemplary DNN module having enhanced processing and utilizing less power by bandwidth control of a cooperating fabric interface will be described.

FIG. 1 is a computing architecture diagram that shows aspects of the configuration and operation of a deep neural network ("DNN") module 105 that implements the technologies disclosed herein, according to one embodiment. The DNN module 105 disclosed herein is configured in some embodiments to solve classification problems (and related problems) such as, but not limited to, object detection, semantic labeling, and feature extraction.

To provide this functionality, the DNN module 105 can implement a recall-only neural network and programmatically support a wide variety of network structures. Training for the network implemented by the DNN module 105 can be performed offline in a server farm, data center, or another suitable computing environment. The result of training a DNN is a set of parameters that can be known as "weights" or "kernels." These parameters represent a transform function that can be applied to an input with the result being a classification or semantically labeled output.

The DNN module 105 disclosed herein can be considered a superscalar processor. The DNN module 105 can dispatch one or more instructions to multiple execution units, called neurons 105F. The execution units can be "simultaneous dispatch simultaneous complete," where each execution unit is synchronized with each of the other execution units. The DNN module 105 can be classified as a single instruction stream, multiple data stream ("SIMD") architecture.

The DNN module 105 includes a number of neurons 105F (e.g. a power of two). A neuron 105F is the base unit in artificial neural networks that is used to model a biological neuron in the brain. The model of a neuron 105F can include the inner product of an input vector with a weight vector added to a bias, with an activation function applied. The processing performed by a neuron 105F in the DNN module 105 described herein is closely mapped to an artificial neuron.

Each neuron 105F in the DNN module 105 is capable of performing weighted sum, max pooling, bypass, and potentially other types of operations. The neurons 105F process input and weight data every clock cycle. Each neuron 105F is synchronized to all other neurons 105F in terms of progress within a kernel to minimize the flow of kernel data within the DNN module 105.

Each neuron 105F can contain a multiplier, an adder, a comparator, and a number of accumulators (not shown in FIG. 1). By having multiple accumulators, the neurons 105F are able to maintain context for multiple different active kernels at a time. Each accumulator is capable of being loaded from a read of the BaSRAM 150 (described below). The accumulators can sum themselves with the contents of other accumulators from other neurons 105F.

The DNN module 105 accepts planar data as input, such as image data. Input to the DNN module 105 is not, however, limited to image data. Rather, the DNN module 105 can operate on any input data presented to the DNN module 105 in a uniform planar format. In one particular embodiment, the DNN module 105 can accept as input multi-planar one-byte or two-byte data frames.

Each input frame can be convolved with an N×K×H×W set of kernels, where N is the number of kernels, K is the number of channels per kernel, H is the height, and W is the width. Convolution is performed on overlapping intervals across the input data where the interval is defined by strides in the X and Y directions. These functions are performed by the neurons 105F and managed by the DNN module 105 and software-visible control registers.

The DNN module 105 supports three main data types: weights; input data/feature maps; and activation data. Input data/feature maps and activation data are, in most cases, two names for the same data with the distinction that when referring to an output of a layer the term activation data is used. When referring to the input of a layer the term input data/feature map is used.

The neurons 105F in the DNN module 105 compute a weighted sum of their inputs and pass the weighted sum through an "activation function" or "transfer function." The transfer function commonly has a sigmoid shape but might also take on the form of a piecewise linear function, step function, or another type of function. The activation function allows the neurons 105F to train to a larger set of inputs and desired outputs where classification boundaries are non-linear.

The DNN module 105 operates on a list of layer descriptors which correspond to the layers of a neural network. The list of layer descriptors can be treated by the DNN module 105 as instructions. These descriptors can be pre-fetched from memory into the DNN module 105 and executed in order. The descriptor list acts as a set of instructions to the DNN module 105. Software tools and/or compilers can be executed on devices external to the DNN module 105 to create the descriptor lists that are executed on the DNN module 105.

Generally, there can be two main classes of descriptors: memory-to-memory move ("M2M") descriptors; and operation descriptors. M2M descriptors can be used to move data to/from the main memory to/from a local buffer (i.e. the line buffer 125 described below) for consumption by the operation descriptors. M2M descriptors follow a different execution pipeline than the operation descriptors. The target pipeline for M2M descriptors can be the internal DMA engine 105B or the configuration registers 105G, whereas the target pipeline for the operation descriptors can be the neurons 105F.

Operational descriptors specify a specific operation that the neurons 105F should perform on a data structure located in local static random-access memory ("SRAM") memory. The operational descriptors are processed in order and are capable of many different layer operations, at least some of which are described herein.

As illustrated in FIG. 1, the DNN module 105 has a memory subsystem with a unique L1 and L2 buffer structure. The L1 and L2 buffers shown in FIG. 1 are designed specifically for neural network processing. By way of example, the L2 buffer 150 can maintain a selected storage capacity. The L1 buffer 125 can maintain a selected storage capacity that can be split between kernel and activation data. The L1 buffer 125 might be referred to herein as the "line buffer 125," and the L2 buffer 150 might be referred to herein as the BaSRAM 150.

Computational data (i.e. inputs data, weights and activation data) is stored in the BaSRAM 150 row-major in some embodiments. The computational data can be organized as two line buffers, where one line buffer contains input data, which might be referred to herein as the "input buffer," and the other line buffer, which might be referred to herein as the "weight buffer," contains kernel weights. The line buffers are filled from the BaSRAM 150 by the load/store unit 105C. Data is accumulated in each line buffer until it has reached its predetermined capacity. The line buffer data is then copied to a shadow buffer in some embodiments and presented to the neurons 105F.

The DNN module 105 can also comprise a number of other components including, but not limited to, a register interface 105G, a prefetch unit 105A, a save/restore unit 105E, a layer controller 105D, and a register interface 105G. The DNN module 105 can include additional or alternate components in some embodiments.

The DNN module 105 operates in conjunction with other external computing components in some configurations. For example, the DNN module 105 is connected to a host application processor system on chip ("the host SoC") 130 in some embodiments. The DNN module 105 can be connected to the host SoC 130 through a PCIe interface, for example. Appropriate PCIe components, such as the PCIe endpoint 135 can be utilized to enable these connections.

The Host SoC 130 serves as the application processor for the DNN module 105. The main operating system, application, and auxiliary sensor processing are performed by the host SoC 130. The host SoC 130 can also be connected to an input data source 102, such as an external camera, that provides input data, such as image data, to the DNN module 105.

DDR DRAM 155 can also be connected to the host SoC 130 that can be used as the main system memory. This memory is accessible from the host SoC 130 across the high bandwidth fabric 120 (e.g. PCIe bus) by way of a memory controller 145. The high bandwidth fabric 120 provides bidirectional direct memory access ("DMA") small messaging transactions and larger DMA transactions. A bridge 115 and low bandwidth fabric 110 can connect the DNN module 105 to the host SoC 130 for sub-module configuration and other functions.

The DNN module 105 can include a DMA engine 105B that is configured to move data to and from main memory 155. The DMA engine 105B has two channels in some embodiments. One channel is dedicated to fetching operation descriptors while the other channel is dedicated to M2M operations. A DMA descriptor can be embedded in the M2M descriptor. Descriptors in this context are DMA descriptors that are used to move the contents of memory, not to be confused with the operation descriptors described above.

To offload the local BaSRAM memory 150, and to provide more space for input data and weight data, the activation output can optionally be streamed directly to DDR memory 155. When streaming data to DDR memory 155, the DNN module 105 will accumulate enough data for a burst transaction on the high bandwidth fabric 120 and will buffer enough transactions to minimize backpressure on the neurons 105F. Additional details regarding the operation of the DNN module 105 will be provided below.

Figure 2:
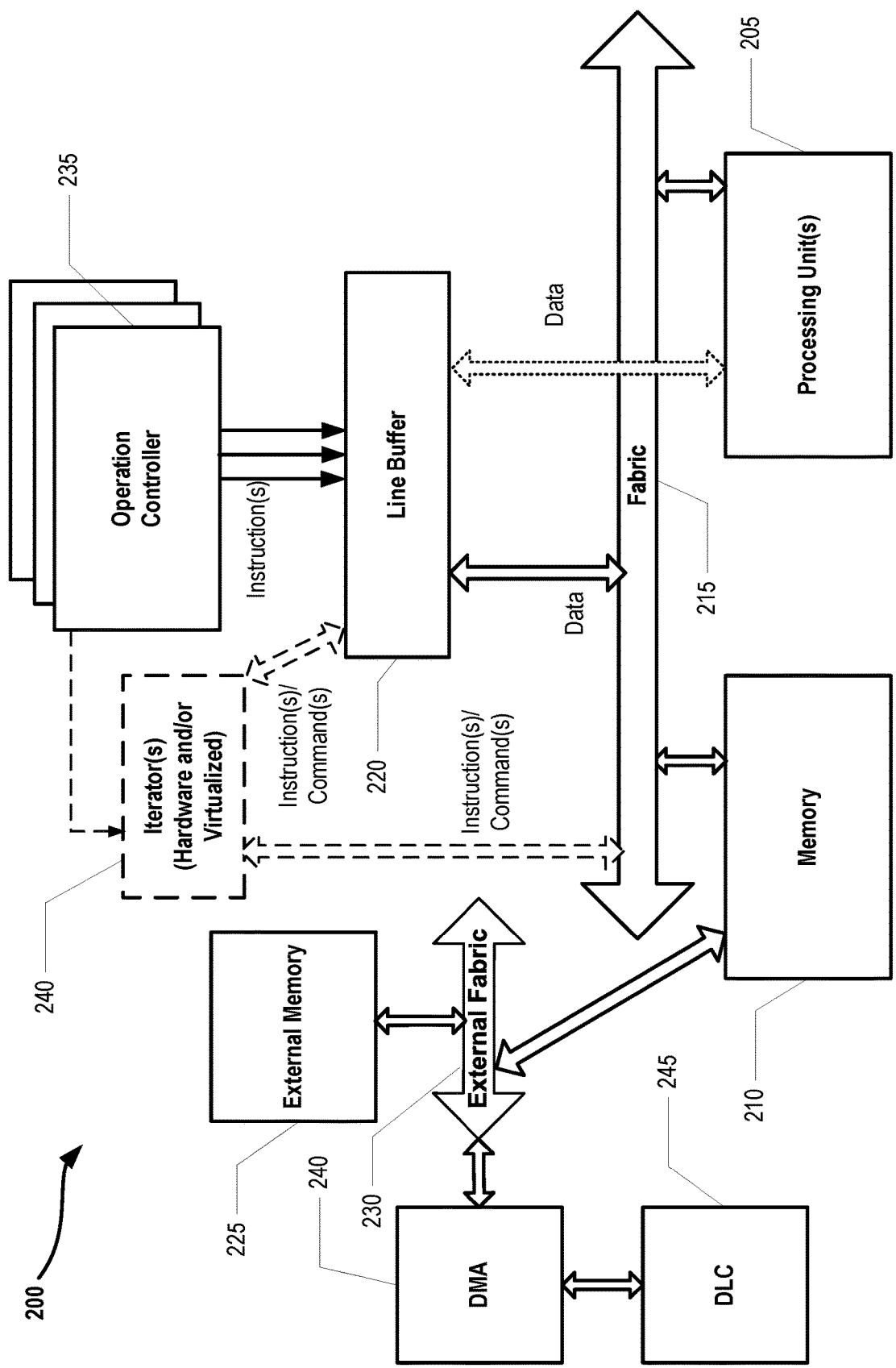
FIG. 2 illustrates a block diagram of an exemplary neural networking environment having cooperating components in accordance with the herein described systems and methods.

FIG. 2 illustrates an exemplary neural network environment 200 operable to employ a directed line buffer 220 as part of data processing. As is shown, the exemplary neural network environment 200 (also referred to herein as a computing device or a computing device environment) comprises one or more operation controllers 235 that cooperate with line buffer 220 to provide one or more instructions for data processing.

Line buffer 220 can operate to receive data from cooperating external memory component 225 through external fabric 230 and fabric 215 as well as operating to receive one or more instructions/commands from iterator(s) 240 (e.g., hardware based and/or virtualized iterators) (e.g., an instruction/command to read data from a cooperating memory component and/or an instruction to write data loaded from the cooperating memory component in the line buffer). Furthermore, as is shown in FIG. 2, exemplary neural network environment can also include direct memory access module (DMA) module 240 and data link control (DLC) module 245.

Operatively, line buffer 220 can shift data according to a selected stride width according to one or more instructions received from one or more operation controller(s) 235 (also referred to herein as a "cooperating controller component 235"). Furthermore, line buffer 220 can cooperate with processing unit(s) (e.g., neuron(s)) to provide the written bit shifted data for further processing directly or indirectly through fabric 215. A neural network environment fabric can be a data bus capable of passing through various data. A directed line buffer can be considered as a memory component capable of reading and writing data and/or data elements according to one or more received instructions.

Operatively DMA module 240 can cooperate with DLC module 245 to provide instructions to throttle external fabric to process data to/from external memory 225 and memory 210. In an illustrative operation, the DMA module 240 can provide one or more instructions to throttle processing of data across external memory 225 and/or memory 210 according to a selected throttling protocol including but not limited to inserting a gap between memory elements processed to and/or from one or more of the cooperating memory components (e.g., 210 and 225) and to limit the number of transactions performed on the data being stored/retrieved from one or more cooperating memory components (e.g., 210 and 225). Other throttling techniques can include limiting the operation of one or more processing units 205 during a given processing cycle. Illustratively, DMA module 240 can operate on one or more configurable registers (not shown) resident in one or more of the cooperating memory components 210 and 225.

Figure 6:
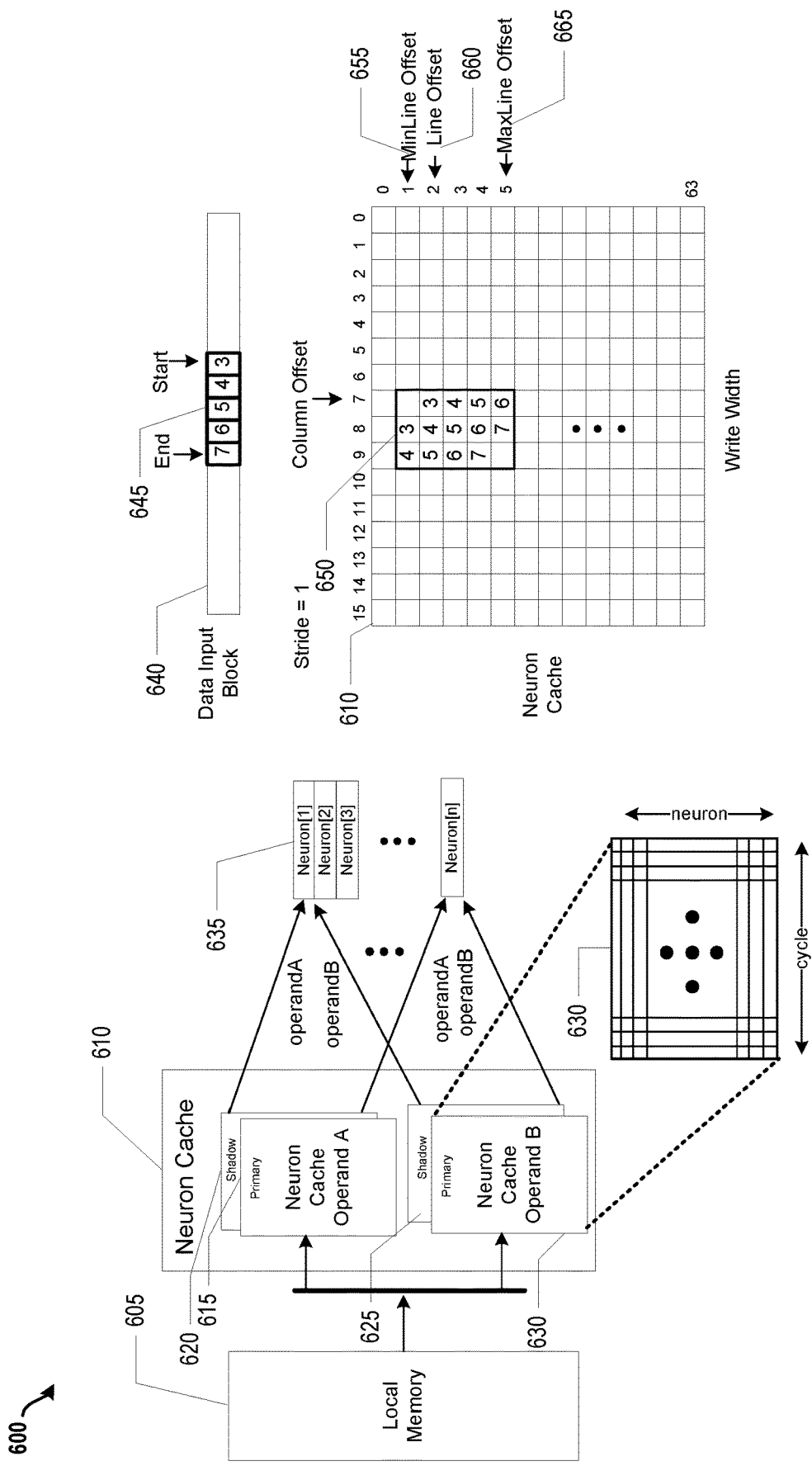
FIG. 6 is a block diagram showing the interaction of various components of an exemplary artificial intelligence/machine learning hardware environment operative to perform data sharing and distribution with the reuse of buffer data.
Figure 7:
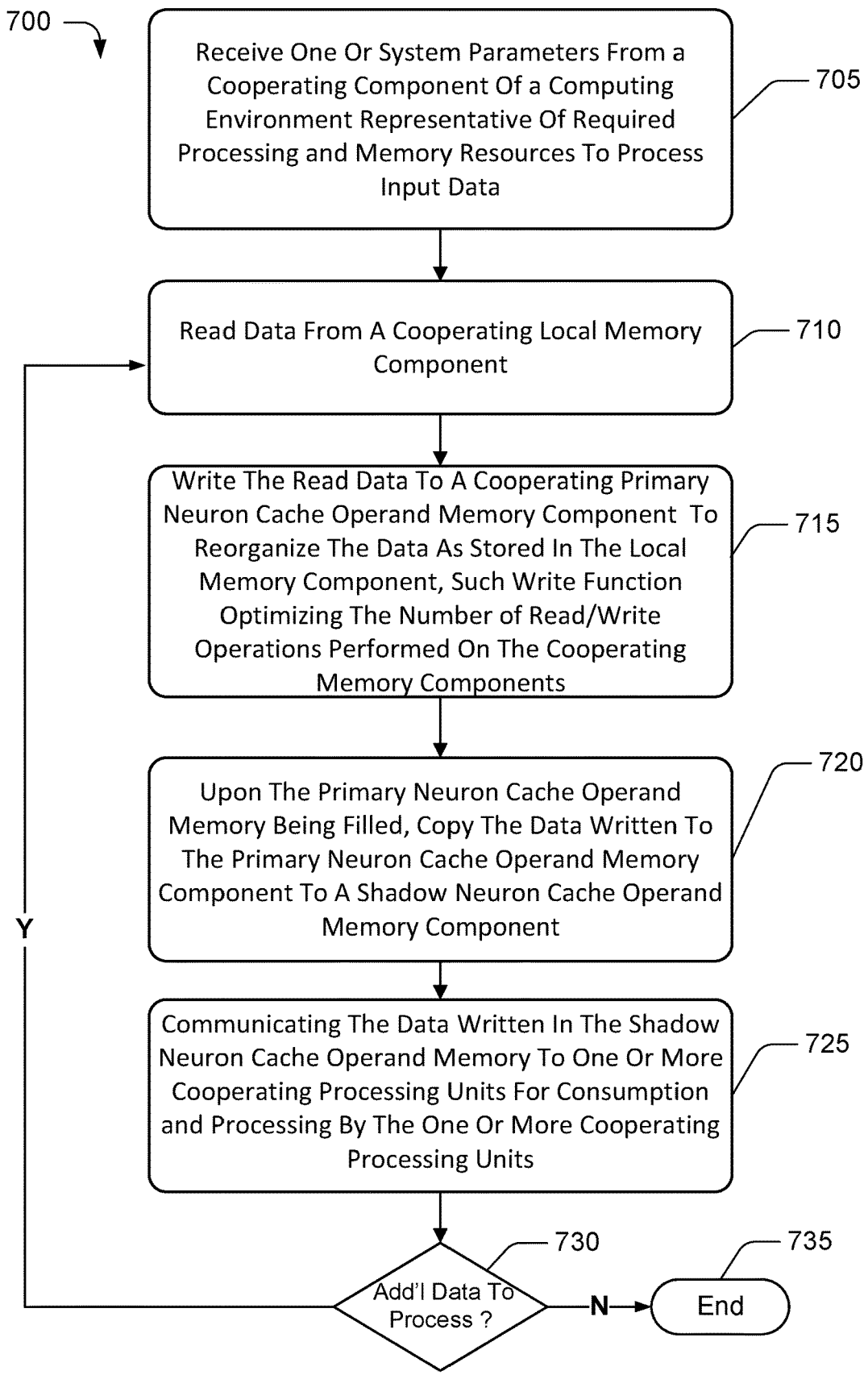
FIG. 7 is a flow diagram of an illustrative process for processing data according to exemplary data distribution/sharing/reuse in accordance with the herein described systems and methods.

In the illustrative operation, the exemplary neural network environment 200 can operatively process data according to the process described in FIG. 7. Specific to the components described in FIG. 2, these components are merely illustrative, as one of ordinary skill in the art would appreciate the processing described in FIGS. 6 and 7 to be also performed by other components than those illustrated in FIG. 2.

Also, as is shown in FIG. 2, the exemplary neural network environment can optionally include one or more iterators (e.g., hardware based and/or virtualized iterators) (as indicated by the dashed lines) that can illustratively operate to iterate input data (not shown) for processing by one more neuron processors 205. It is appreciated by one skilled in the art that such optional inclusion of exemplary one or more iterators is merely illustrative as the inventive concepts described by the herein disclosed systems and methods are operative in an exemplary neural network environment 200 operating without any iterators.

Figure 3:
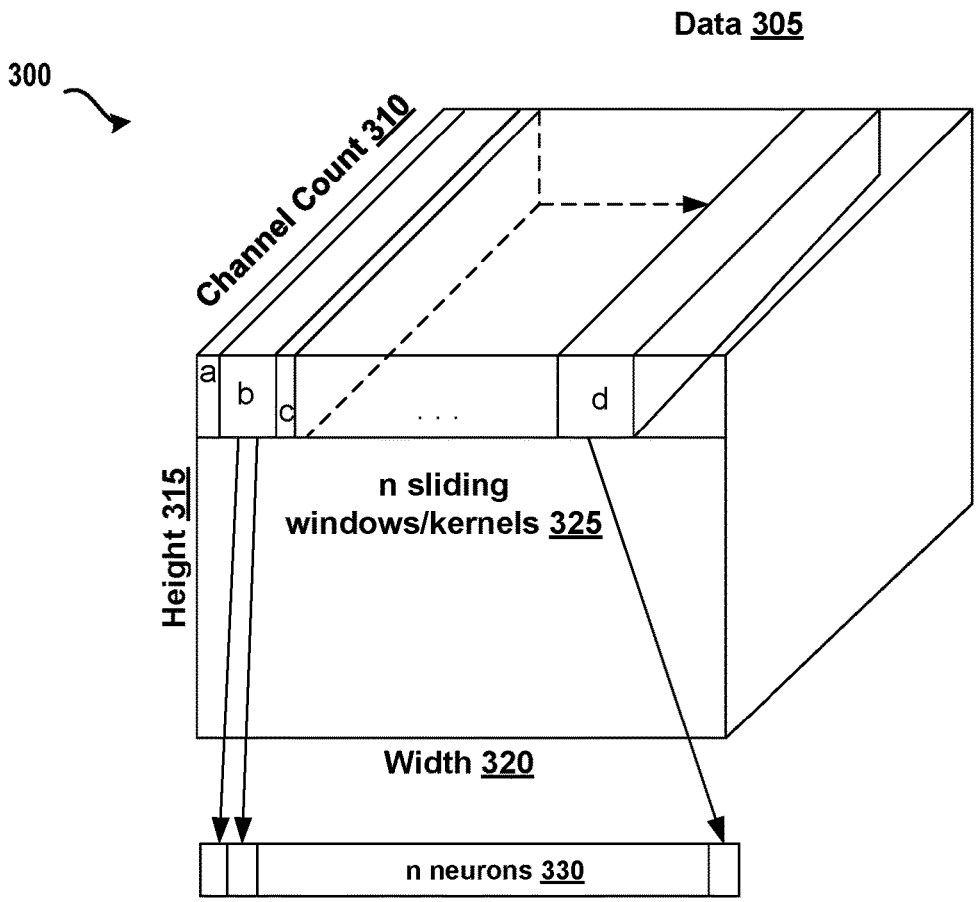
FIG. 3 illustrates a block diagram of exemplary input data represented in an illustrative logical data mapping according to the herein described systems and methods.
Figure 3:
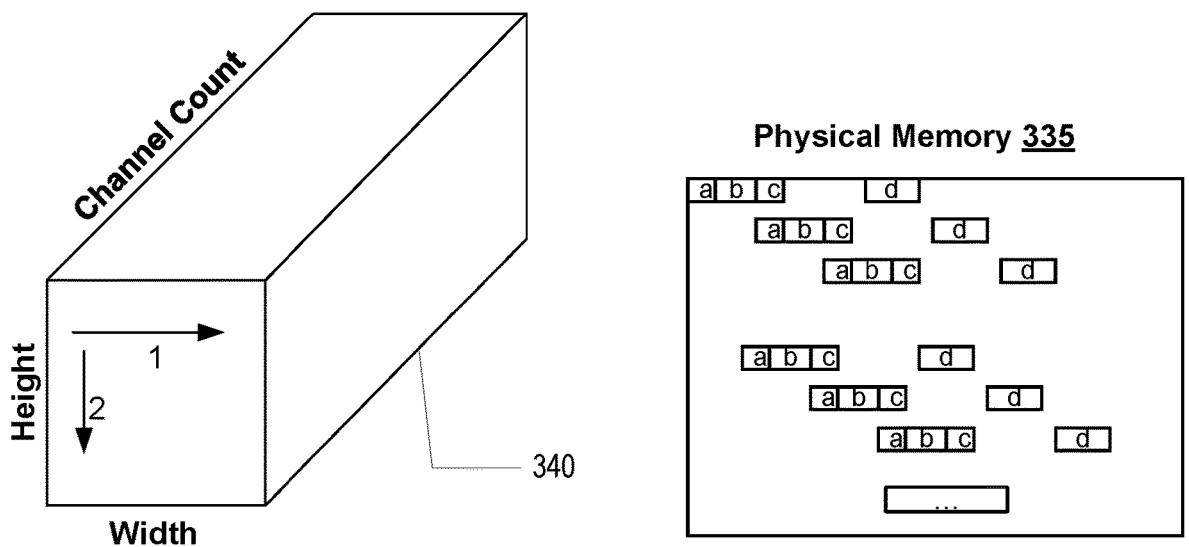

FIG. 3 illustrates an example logical data mapping 300 for exemplary input data. As is shown, data 305 can be represented as data having a certain dimension 340 (e.g., such that data dimensions taken as a whole can define a data volume) comprising channel count 310, height 315, and width 320. According to the herein described systems and methods, data 305 can be portioned and prepared for processing by cooperating n neurons 330 such that a first portion a can be communicated to a first neuron, a second portion b can be communicated to a second neuron, and so forth until n portions are communicated to n neurons.

In an illustrative operation, the portions of data 305 can be determined using n sliding window/kernels 325 based on one or more instructions provided by a cooperating controller component of an exemplary neural network environment (e.g., 200 of FIG. 2). Further, as is shown, the input data portions a, b, c, and d can be addressed to a physical memory 325 using one or more initialization parameters provided by a cooperating operation controller component (235) of an exemplary neural network environment (e.g., 200 of FIG. 2).

Figure 4:
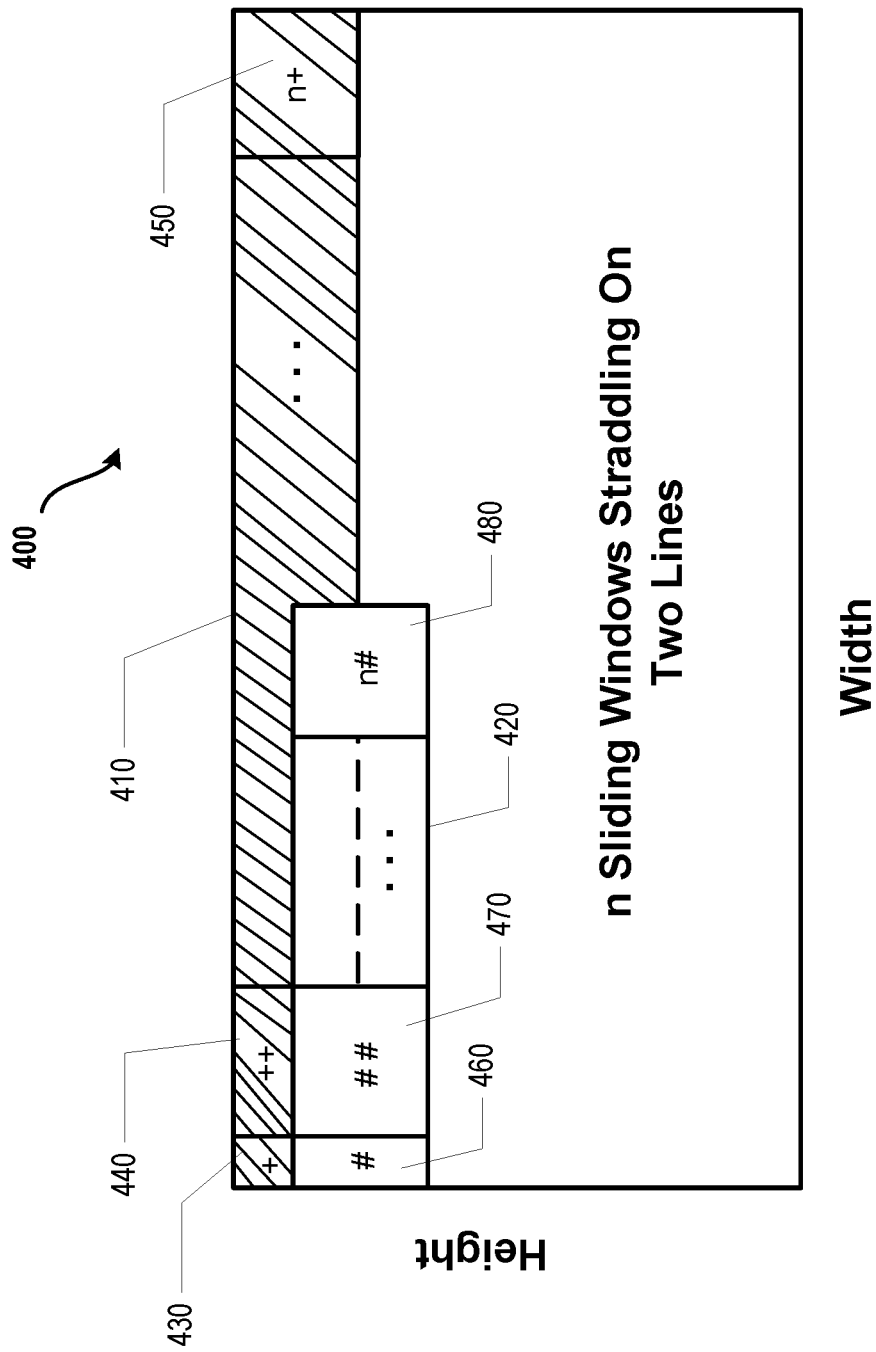
FIG. 4 illustrates a block diagram of exemplary input data represented in an illustrative logical data mapping showing the use of illustrative n sliding windows operative to straddle one or more lines of the illustrative logical data mapping.

FIG. 4 illustrates an exemplary logical data map 400 of exemplary input data (not shown). Exemplary logical data map 400 comprises a first line 410 (illustrated with diagonal marks) and a second line 420 (illustrated by dashes). Each map line can include a number of sliding windows (e.g., 430, 440, and 450 for the first line 410 and 460, 470, and 480 for the second line 420). Additionally, as is shown, the logical data map 400 shows the ability of the sliding windows to straddle a data dimensional boundary of the input data (e.g., straddling the first line 410 and the second line 420). Such ability allows for increased performance as more data can be prepared more efficiently for subsequent processing by the cooperating neural network processing components (e.g., 205 of FIG. 2).

Figure 5:
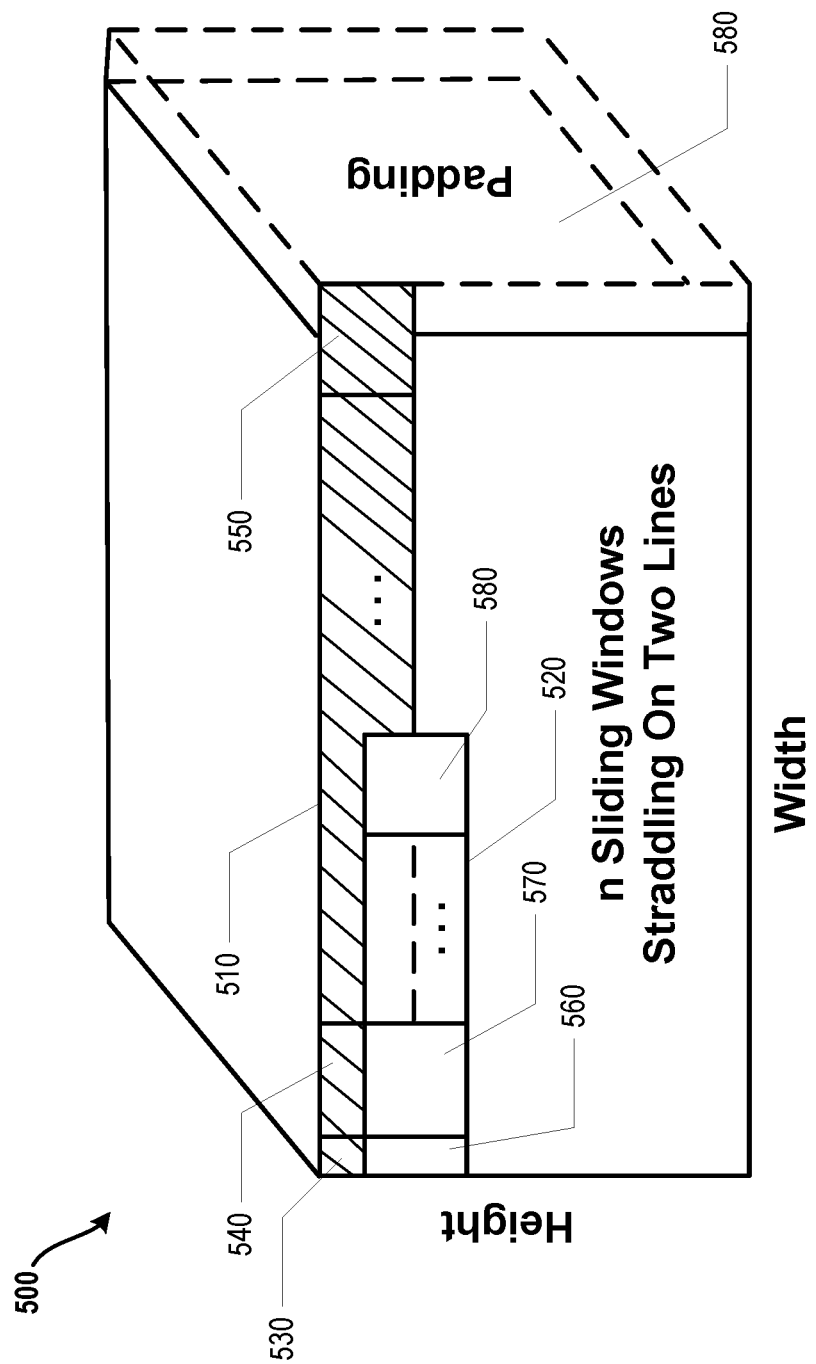
FIG. 5 illustrates a block diagram of exemplary input data represented in an illustrative logical data mapping showing the use of illustrative n sliding windows operative to straddle one or more lines of the illustrative logical data mapping operative to allow for data padding as a processing enhancement in accordance with the herein described systems and methods.

FIG. 5 is similar to FIG. 4 and is presented to describe the ability of the herein described systems and methods to allow for the use of padding to further enhance the performance characteristics of an exemplary neural network environment (e.g., 100 of FIG. 1 and 200 of FIG. 2). As is shown, logical data map 500 (of exemplary input data not shown) can include various sliding windows (530, 540, 550, 560, 570, and 580) that straddle across one or more lines (e.g., 510 and 520). Additionally, the logical data map 500 can also include padding 580.

In an illustrative operation, at runtime of an exemplary neural network environment (100 of FIG. 1 or 200 of FIG. 2), padding 580 can be added dynamically. The operation controller 235 of FIG. 2 can specify the amount of padding to be used on each of the dimensions 340 shown in FIG. 3 (e.g., such that the dimensions taken collectively can be considered a data volume) of the input data (e.g., blob), and the neural network environment (e.g., iterator controller instructions) can operatively construct data volumes as if the padding was physically present in memory. Default values can also be generated by the exemplary neural network environment (e.g., iterator controller instructions) in the iterator output positions where the padding was added.

The particular implementation of the technologies disclosed herein is a matter of choice dependent on the performance and other requirements of the computing device. Accordingly, the logical operations described herein are referred to variously as states, operations, structural devices, acts, or modules. These states, operations, structural devices, acts and modules can be implemented in hardware, software, firmware, in special-purpose digital logic, and any combination thereof. It should be appreciated that more or fewer operations can be performed than shown in the FIGS. and described herein. These operations can also be performed in a different order than those described herein.

FIG. 6 is a diagram showing the interaction of various components of an exemplary computing environment 600 (e.g., artificial intelligence/machine learning hardware environment as expressed as an illustrative DNN computing environment) operative to perform data distribution/sharing as well as buffer reuse to enhance overall processing performance as well reduce power consumption of exemplary computing environment 600. As is shown, exemplary computing environment cooperating local memory component 605, neuron buffer 610 as well as neurons 635 (e.g., exemplary cooperating one or more processing units). Further, as is shown in FIG. 6, neuron buffer 610 can comprise a cooperating primary neuron buffer operand A memory component 615, a cooperating shadow neuron buffer operand A memory component 620, a cooperating primary neuron buffer operand B memory component 630, and a cooperating shadow neuron buffer operand B memory component 625. Illustratively, shadow neuron buffer can be implemented as a queue of shadow memory components.

In an illustrative implementation, neuron buffer 610 can be used to provide input to the neurons 635 at a rate that keeps all neurons busy every cycle. Illustratively, the size of the neuron buffer 510 can be dependent on the number of neurons 635, the size of a data cell (e.g., one or two bytes—not shown), and the number of values pre-load for each neuron, which can be equivalent to the number of cycles of compute the neurons can perform on the input data.

In the illustrative implementation, neuron buffer 610 can be comprised of four memory structures: a cooperating primary neuron buffer operand A memory component 615, a cooperating shadow neuron buffer operand A memory component 620, a cooperating primary neuron buffer operand B memory component 630, and a cooperating shadow neuron buffer operand B memory component 625. In the illustrative implementation, two of those memory structures can be allocated for operand A and two of them can be allocated for operand B.

It is appreciated by one of ordinary skill in the art that in some implementations, the techniques disclosed herein use two operands, but any number of operands can be used as well various data cell sizes (i.e., any data cell size can be used). Illustratively, each operand pair can be comprised of a primary memory and a shadow memory. Operatively, such memory pairs can be a double buffer where the shadow copy of the written data can store the current data for consumption by neurons 635 and the and the data written in the primary neuron buffer operand memory component is the next data to be copied to the shadow copy for consumption by neurons 635. Furthermore, it is appreciated that inventive concepts described herein can be deployed using only a primary memory buffer without the need to copy the data to a shadow memory buffer. In such case, illustratively, the control logic of the computing environment would ensure that the neurons would have coherent data for processing from the primary memory buffer.

In an illustrative operation, the rows of neuron buffer 610 can be mapped to each neuron 635. By way of example, for instance, row[0] can represent the data for neuron[0] and row[1] can represent the data for neuron[1]. In this example, the number of neurons can be represented by variable N. Illustratively, the columns of the neuron buffer 610 can be mapped to time in terms of clock cycle. For example, column[0] can represent the data that neurons 635 can process in cycle 0 relative to the last copy of the data stored in a the cooperating shadow neuron buffer memory component (e.g., 620 or 625). In the example, the number of cycles required to process the exemplary input data can be represented with variable K.

Accordingly, in an illustrative operation, exemplary input data 640 can be read from cooperating local memory component 605 and written to either or both neuron buffer operand memory components 615 or 630. In the illustrative operation, such data read can be repeated until the primary buffers 615 and 630 have enough data to keep N neurons busy for K cycles. Operatively, upon the final write to the primary buffers 615 and 630, the input data can be copied to cooperating shadow neuron buffer operand memory components 620 and 630. The control information to perform the "copy-to-shadow" can be included with other control information that defines the read/write operation.

The exemplary neurons 635 can begin operating on the data in the shadow copy the cycle after the copy-to-shadow occurs. In an illustrative operation, the one or more neurons 635 can read a value from cooperating neuron buffer operand A memory component 615 and cooperating neuron buffer operand B memory component 630. In an exemplary operation, the two read values can then be multiplied and added to the accumulator (not shown) in the one or more neurons 635.

In an illustrative operation, there can be a number of neuron buffer control parameters that can impact the writing of data to the primary neuron buffer operand memory components 615 and 630. Such parameters can include but are not limited to: Data Block—This can be thirty-two (32) Bytes of data that can be read from the cooperating local memory component 605 (e.g. 1 MB memory) and can be written to the neuron buffer 610; Start—The start position in the input block from which to start reading the data; End—The end position in the input block up to which to read the data; Column Offset—The column in each neuron buffer entry at which data first written; Line Offset—The neuron buffer entry at which the first full write width can be written; Minimum Line Offset—The minimum neuron buffer entry in which data can be written Maximum Line Offset—The maximum neuron buffer entry in which data can be written; Width—The total number of word values that can be written to the neuron buffer entry; Stride—The stride that can be used used for shifting the data blockafter each neuron buffer entry is updated; Stride Remainder—Number of values from a complete stride that can be missed during the last data write to the one or more neurons; Stride Repeat—specifies the number of rows of a stride before incrementing; and Stride Reset—specifies the modification constant selection value in the one or more neurons. Additionally, in the illustrative operation, there can be a number of parameter constraints that impact the scope of the parameters.

As is shown in FIG. 6, data can be read from local memory component 605 and written to neuron buffer 610.

This write to the buffer 610 can occur in a single clock cycle. The write can be bounded by the parameters described herein such that only the cells in the desired window can be updated. All other cells can retain their previous values. Some cells, that are within the desired window, can also retain their previous values dependent on the stride.

The basic premise behind a buffer-line write is that all rows in the buffer can be written to simultaneously (i.e., same clock cycle), such that each row can utilize the same data and each row can utilize a different shift value dependent on the parameters described herein. As is shown in FIG. 6, data input block 640 can include a number of cells 645. As is shown, the input data 640 can be written to neuron buffer 610 such that rows 1-5 all receive data "76543". As is shown, row 1 can shift the data left 1 cycle because it is 1 less than the LineOffset setting. Row 2 can operate to not shift the data because it lines up with the LineOffset setting. Row 5 can shift the data right 3 cells because row 5 is 3 lines higher than the LineOffset. For this example, the stride value can be set to a value of 1. Alternatively, if the stride value were set to 2, then Row 1 would have shifted the data left by 2 cells, and so on with other stride values.

In an illustrative implementation, the row shifting operations can be expressed according to a number of equations including but not limited to:

$$a[n]=(neuronIndex-lineOffset)>>strideRepeat;$$

$$a[n]=(strideReset!=0)? \; a[n] \& ((1<<strideReset)-1): a[n]; \text{ and}$$

$$Shift[n]=(a[n]*stride)+strideRemainder+(start-columnOffset).$$

In an illustrative implementation, each of the N lines in the neuron buffer can receive the same M bytes of data as input. Illustratively, each row (n) can shift the input data to get it into the correct position. For example, if stride in the equation is set to a value of 0, then each of the rows will have the same data. However, in this exemplar, if the stride is set to a value of 1, the data can be shifted to the right by one. In this way the neuron buffer 610 can efficiently distribute the data for overlapped consumption.

The columns of the neuron buffer can represent the cycle in which the data is consumed. Since the neuron buffer can contain 16 columns as is shown in FIG. 6, the columns can represent 16 cycles of data which the one or more cooperating neurons 635 can be engaged. For each neuron buffer there can be 2 copies of the data—a primary copy and the shadow copy. While the iterators fill the primary copy, the neurons can operate on the shadow copy.

In an illustrative operation, once the primary copy is filled and the shadow copy is consumed, the primary copy data can be moved to the shadow copy and the iterators can begin filling the primary copy with the next set of data. In the illustrative operation, the write from the primary buffer to the shadow copy can be the synchronization point for the neurons. At such an exemplary point, all neurons must have completed processing of all the data in the shadow copy as its contents will be completely over-written.

In an illustrative implementation, the data used by two neighboring neurons can be either exactly the same or can include a subset of the data from a neighboring neuron. In such instance, the primary buffer memory and the data reconfiguration logic associated with the primary buffer memory can operatively, reconfigure the data to be used by neurons resulting in reducing multiple data reads from outside memory. By way of example, if the input data requires a 3 by 3 convolution with stride 1 to produce 64 outputs, 64 by 3 by 3 input values would be required (i.e., 3 by 3 input values per neuron). A calculated data input size (i.e., assuming a single row of data is being outputted) can be calculated as (63+3)*3. Applying the inventive concepts described herein, 66*3 elements can be read for input whereas a conventional approach will have to read 64 by 3 by 3 elements (i.e., almost 3 times more than what is required to be read by the operative systems and methods described herein). Also, for neurons that work only on a single element, it may take 9 cycles to digest the data. Comparatively, with an data input interface that can support reading 32 elements per cycle, in as little as 7 cycles the input data could be read and reconfigured (i.e., 32*7>66*3). However, with current approaches it would take 18 cycles to fill the data. As a result, the neurons would effectively be stalled for 9 cycles as they would have finished processing in 9 cycles.

FIG. 7 is a flow diagram of an illustrative process 700 performing data distribution and sharing as well as buffer reuse in an illustrative artificial intelligence/machine learning hardware environment illustratively expressed as an exemplary DNN network environment. As is shown, processing begins at block 705 where one or more system parameters from a cooperating component of a computing environment are received that can be representative of the required processing (e.g., data functions to be performed) and memory resources for processing exemplary input data.

Processing then proceeds to block 710 where data from a cooperating local memory component is read. The read-in data can then be written to a cooperating primary neuron buffer operand memory component at block 715 such that the read-in data can be reorganized to optimize the number of read/write operations that are performed on the cooperating memory local memory component and/or the primary neuron buffer operand memory component.

Processing then proceeds to block 720 where upon the primary neuron buffer operand memory component being filled a copy of the data written to the primary neuron buffer operand memory component is written to a shadow neuron buffer operand memory component. The data stored in the shadow neuron buffer operand memory component being available for consumption by one or more cooperating processing units at block 725.

Processing then proceeds to block 730 where a check is performed to determine if there is additional data that requires processing. If there is no additional data, processing terminated at block 735. If additional data requires processing, processing reverts to block 710 and proceeds from there.

Figure 8:
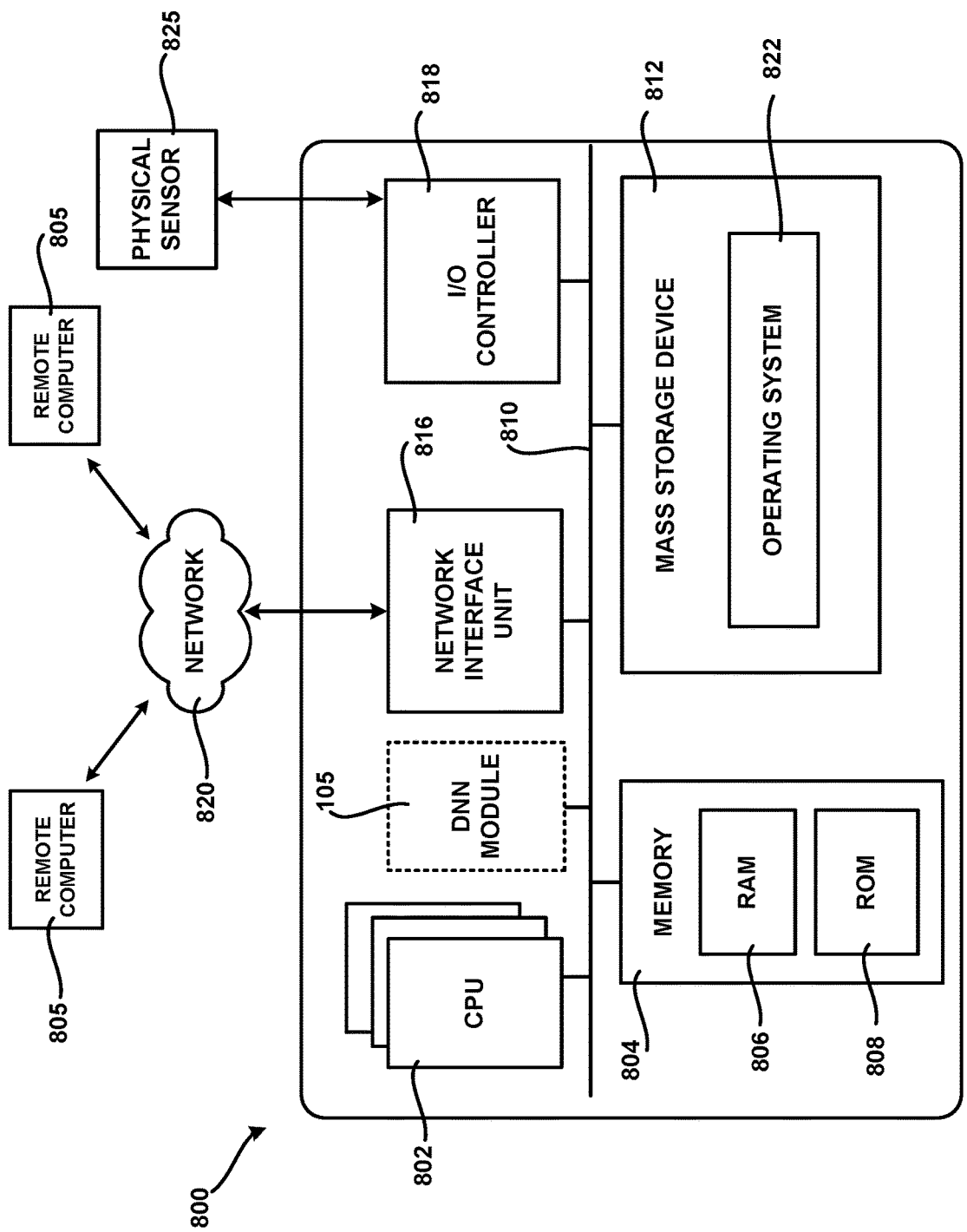
FIG. 8 is a computer architecture diagram showing an illustrative computer hardware and software architecture for a computing device that can act as an application host for the DNN module presented herein, according to one embodiment.

FIG. 8 is a computer architecture diagram showing an illustrative computer hardware and software architecture for a computing device that can act as an application host for the DNN module 105 presented herein. In particular, the architecture illustrated in FIG. 8 can be utilized to implement a server computer, mobile phone, an e-reader, a smartphone, a desktop computer, an AR/VR device, a tablet computer, a laptop computer, or another type of computing device suitable for use with the DNN module 105.

The computer 800 illustrated in FIG. 8 includes a central processing unit 802 ("CPU"), a system memory 804, including a random-access memory 806 ("RAM") and a read-only memory ("ROM") 808, and a system bus 810 that couples the memory 804 to the CPU 802. A basic input/output system ("BIOS" or "firmware") containing the basic routines that help to transfer information between elements within the computer 800, such as during startup, can be stored in the ROM 808. The computer 800 further includes a mass storage device 812 for storing an operating system 822, application programs, and other types of programs. The mass storage device 812 can also be configured to store other types of programs and data.

The mass storage device 812 is connected to the CPU 802 through a mass storage controller (not shown) connected to the bus 810. The mass storage device 812 and its associated computer readable media provide non-volatile storage for the computer 800. Although the description of computer readable media contained herein refers to a mass storage device, such as a hard disk, CD-ROM drive, DVD-ROM drive, or USB storage key, it should be appreciated by those skilled in the art that computer readable media can be any available computer storage media or communication media that can be accessed by the computer 800.

Communication media includes computer readable instructions, data structures, program modules, or other data in a modulated data signal such as a carrier wave or other transport mechanism and includes any delivery media. The term "modulated data signal" means a signal that has one or more of its characteristics changed or set in a manner so as to encode information in the signal. By way of example, and not limitation, communication media includes wired media such as a wired network or direct-wired connection, and wireless media such as acoustic, radio frequency, infrared and other wireless media. Combinations of the any of the above should also be included within the scope of computer readable media.

By way of example, and not limitation, computer storage media can include volatile and non-volatile, removable and non-removable media implemented in any method or technology for storage of information such as computer readable instructions, data structures, program modules or other data. For example, computer storage media includes, but is not limited to, RAM, ROM, EPROM, EEPROM, flash memory or other solid-state memory technology, CD-ROM, digital versatile disks ("DVD"), HD-DVD, BLU-RAY, or other optical storage, magnetic cassettes, magnetic tape, magnetic disk storage or other magnetic storage devices, or any other medium that can be used to store the desired information and which can be accessed by the computer 800. For purposes of the claims, the phrase "computer storage medium," and variations thereof, does not include waves or signals per se or communication media.

According to various configurations, the computer 800 can operate in a networked environment using logical connections to remote computers through a network such as the network 820. The computer 800 can connect to the network 820 through a network interface unit 816 connected to the bus 810. It should be appreciated that the network interface unit 816 can also be utilized to connect to other types of networks and remote computer systems. The computer 800 can also include an input/output controller 818 for receiving and processing input from a number of other devices, including a keyboard, mouse, touch input, an electronic stylus (not shown in FIG. 8), or a physical sensor such as a video camera. Similarly, the input/output controller 818 can provide output to a display screen or other type of output device (also not shown in FIG. 8).

It should be appreciated that the software components described herein, when loaded into the CPU 802 and executed, can transform the CPU 802 and the overall computer 800 from a general-purpose computing device into a special-purpose computing device customized to facilitate the functionality presented herein. The CPU 802 can be constructed from any number of transistors or other discrete circuit elements, which can individually or collectively assume any number of states. More specifically, the CPU 802 can operate as a finite-state machine, in response to executable instructions contained within the software modules disclosed herein. These computer-executable instructions can transform the CPU 802 by specifying how the CPU 802 transitions between states, thereby transforming the transistors or other discrete hardware elements constituting the CPU 802.

Encoding the software modules presented herein can also transform the physical structure of the computer readable media presented herein. The specific transformation of physical structure depends on various factors, in different implementations of this description. Examples of such factors include, but are not limited to, the technology used to implement the computer readable media, whether the computer readable media is characterized as primary or secondary storage, and the like. For example, if the computer readable media is implemented as semiconductor-based memory, the software disclosed herein can be encoded on the computer readable media by transforming the physical state of the semiconductor memory. For instance, the software can transform the state of transistors, capacitors, or other discrete circuit elements constituting the semiconductor memory. The software can also transform the physical state of such components in order to store data thereupon.

As another example, the computer readable media disclosed herein can be implemented using magnetic or optical technology. In such implementations, the software presented herein can transform the physical state of magnetic or optical media, when the software is encoded therein. These transformations can include altering the magnetic characteristics of particular locations within given magnetic media. These transformations can also include altering the physical features or characteristics of particular locations within given optical media, to change the optical characteristics of those locations. Other transformations of physical media are possible without departing from the scope and spirit of the present description, with the foregoing examples provided only to facilitate this discussion.

In light of the above, it should be appreciated that many types of physical transformations take place in the computer 800 in order to store and execute the software components presented herein. It also should be appreciated that the architecture shown in FIG. 8 for the computer 800, or a similar architecture, can be utilized to implement other types of computing devices, including hand-held computers, video game devices, embedded computer systems, mobile devices such as smartphones, tablets, and AR/VR devices, and other types of computing devices known to those skilled in the art. It is also contemplated that the computer 800 might not include all of the components shown in FIG. 8, can include other components that are not explicitly shown in FIG. 8, or can utilize an architecture completely different than that shown in FIG. 8.

Figure 9:
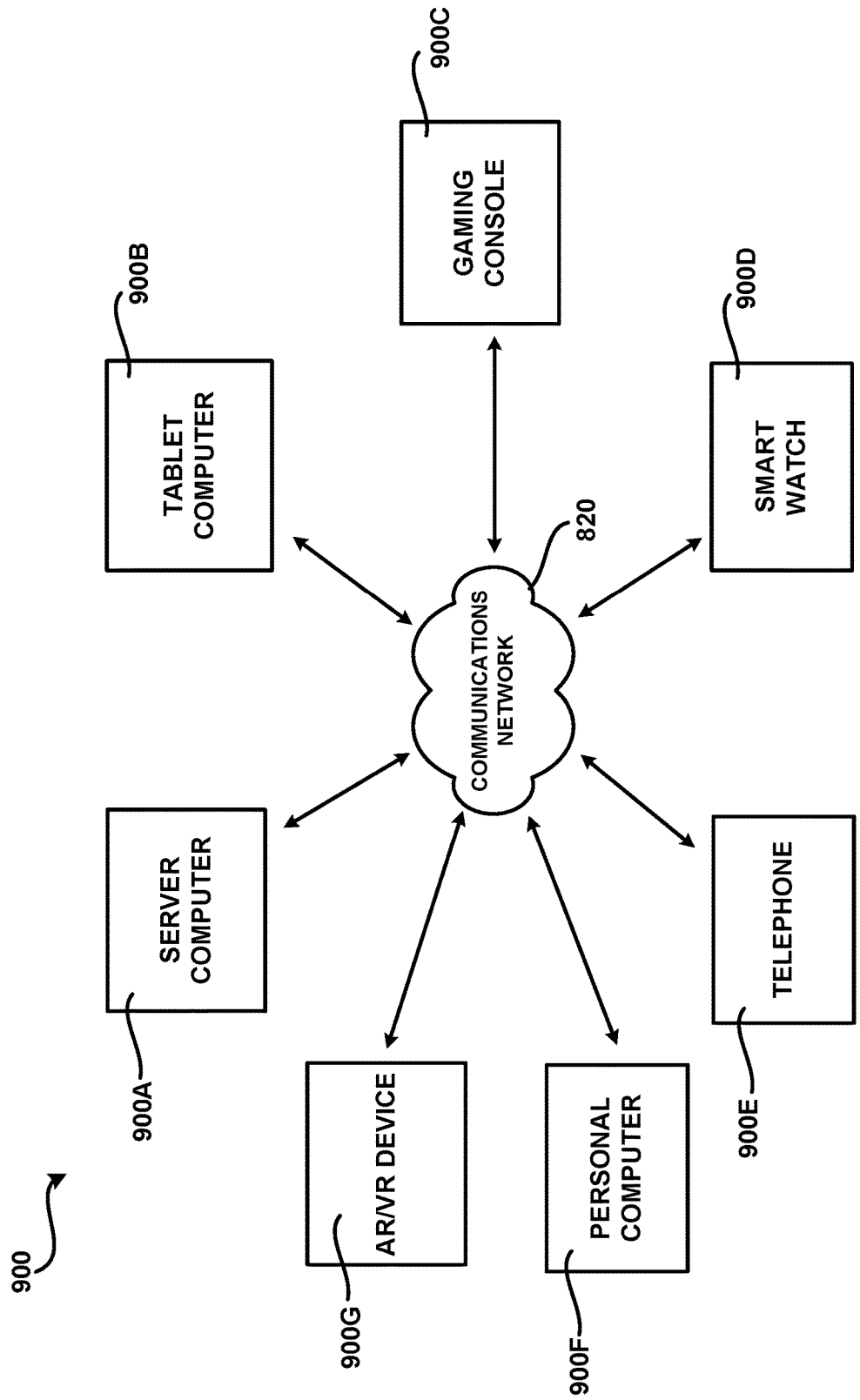
FIG. 9 is a network diagram illustrating a distributed computing environment in which aspects of the disclosed technologies can be implemented, according to various embodiments presented herein.

FIG. 9 is a network diagram illustrating a distributed network computing environment 900 in which aspects of the disclosed technologies can be implemented, according to various embodiments presented herein. As shown in FIG. 9, one or more server computers 900A can be interconnected via a communications network 820 (which may be either of, or a combination of, a fixed-wire or wireless LAN, WAN, intranet, extranet, peer-to-peer network, virtual private network, the Internet, Bluetooth communications network, proprietary low voltage communications network, or other communications network) with a number of client computing devices such as, but not limited to, a tablet computer 900B, a gaming console 900C, a smart watch 900D, a telephone 900E, such as a smartphone, a personal computer 900F, and an AR/VR device 900G.

In a network environment in which the communications network 820 is the Internet, for example, the server computer 900A can be a dedicated server computer operable to process and communicate data to and from the client computing devices 900B-900G via any of a number of known protocols, such as, hypertext transfer protocol ("HTTP"), file transfer protocol ("FTP"), or simple object access protocol ("SOAP"). Additionally, the networked computing environment 900 can utilize various data security protocols such as secured socket layer ("SSL") or pretty good privacy ("PGP"). Each of the client computing devices 900B-900G can be equipped with an operating system operable to support one or more computing applications or terminal sessions such as a web browser (not shown in FIG. 9), or other graphical user interface (not shown in FIG. 9), or a mobile desktop environment (not shown in FIG. 9) to gain access to the server computer 900A.

The server computer 900A can be communicatively coupled to other computing environments (not shown in FIG. 9) and receive data regarding a participating user's interactions/resource network. In an illustrative operation, a user (not shown in FIG. 9) may interact with a computing application running on a client computing device 900B-900G to obtain desired data and/or perform other computing applications.

The data and/or computing applications may be stored on the server 900A, or servers 900A, and communicated to cooperating users through the client computing devices 900B-900G over an exemplary communications network 820. A participating user (not shown in FIG. 9) may request access to specific data and applications housed in whole or in part on the server computer 900A. These data may be communicated between the client computing devices 900B-900G and the server computer 900A for processing and storage.

The server computer 900A can host computing applications, processes and applets for the generation, authentication, encryption, and communication of data and applications, and may cooperate with other server computing environments (not shown in FIG. 9), third party service providers (not shown in FIG. 9), network attached storage ("NAS") and storage area networks ("SAN") to realize application/data transactions.

It should be appreciated that the computing architecture shown in FIG. 8 and the distributed network computing environment shown in FIG. 9 have been simplified for ease of discussion. It should also be appreciated that the computing architecture and the distributed computing network can include and utilize many more computing components, devices, software programs, networking devices, and other components not specifically described herein.

EXAMPLE CLAUSES

The disclosure presented herein encompasses the subject matter set forth in the following clauses.

Example Clause A, a system for enhanced data processing in an artificial intelligence/machine learning computing environment, the system comprising: at least one neural network processor; at least one memory component; and at least one memory in communication with the at least one neural network processor, the at least one memory having computer-readable instructions stored thereupon that, when executed by the at least one processor, cause the at least one processor to: receive one or more processing parameters from a cooperating component of the computing environment representative of characteristics of data processing comprising the characteristics of the input data and the type of processing to be performed by the computing environment; read from the memory component input data; reorganize the read input data for writing to a cooperating neuron buffer according to the one or more processing parameters during one or more data processing cycles of the artificial intelligence/machine learning computing environment; write the reorganized data to one or more primary neuron buffer memory components of the neuron buffer; and copy the written data of the one or more primary neuron buffer memory components to one or more shadow neuron buffer memory components.

Example Clause B, the system of Example Clause A, wherein the computer readable instructions further cause the at least one processor to communicate the data copied to the one or more shadow neuron buffer memory components to one or more cooperating neurons for processing.

Example Clause C, the system of Example Clause A and B, wherein the copy operation of the written data of the one or more primary neuron buffer memory components is performed upon the memory capacity being reach of the one or more primary neuron buffer memory components during a data transaction processing cycle.

Example Clause D, the system of Example Clauses A through C, wherein the computer-readable instructions further cause the at least one processor to reorganize the data according to a selected stride value.

Example Clause E, the system of Example Clauses A through D, wherein the one or more primary neuron buffer memory components comprise a number of rows and columns, the number of columns proportional to the number of data cycles required to process the input data.

Example Clause F, the system of Example Clauses A through E, wherein the computer readable instructions further cause the at least one processor to process the one or more processing parameters by one or more other computing environment components to generate one or more instructions specific to the reorganization of the read input data.

Example Clause G, the system of Example Clauses A through F, wherein the reorganization of the data is calculated by the one or more other computing environment components to communicate data to every available one or more neurons during a data transaction cycle.

Example Clause H, a computer-implemented method, comprising: receiving one or more processing parameters from a cooperating component of the computing environment representative of characteristics of data processing comprising the characteristics of the input data and the type of processing to be performed by the computing environment; reading from the memory component input data; reorganizing the read input data for writing to a cooperating neuron buffer according to the one or more processing parameters; writing the reorganized data to one or more primary neuron buffer memory components of the neuron buffer; copying the written data of the one or more primary neuron buffer memory components to one or more shadow neuron buffer memory components; and communicating the data copied to the one or more shadow neuron buffer memory components to one or more cooperating neurons for processing.

Example Clause I, the computer-implemented method of Example Clause H, further comprising reading data from the memory component for writing to a cooperating first primary neuron buffer memory component.

Example Clause J, the computer-implemented method of Example Clauses H and I, further comprising reading data from the memory component for writing to a cooperating second primary neuron buffer memory component.

Example Clause K, the computer-implemented method of claim Example Clause H through J, further comprising copying the data written to the cooperating first primary neuron buffer memory to a cooperating first shadow neuron buffer memory component and copying the data written to the cooperating second primary neuron buffer memory component to a cooperating second shadow neuron buffer memory component.

Example Clause L, the computer-implemented method of Example Clauses H through K, further comprising performing a selected function on the data read from the cooperating first shadow neuron buffer memory component and data read from the cooperating second shadow neuron buffer memory component, such function comprising addition, multiplication, subtraction, and other arithmetic functions to generate function-applied data.

Example Clause M, the computer-implemented method of Example Clauses H through L, further communicating the function-applied data to one or more cooperating neurons for processing.

Example Clause N, the computer-implemented method of Example Clauses H through M, further comprising mapping the rows of the cooperating first primary neuron buffer memory component to a neuron of the one or more the cooperating neurons.

Example Clause O, the computer-implemented method of Example Clauses H through N, further comprising mapping the columns of the cooperating first primary neuron buffer memory component to a time variable representative of the clock cycles of the computing environment.

Example Clause P, a computer-readable storage medium having computer-executable instructions stored thereupon which, when executed by one or more processors of a computing device, cause the one or more processors of the computing device to: receive one or more processing parameters from a cooperating component of the computing environment representative of characteristics of data processing comprising the characteristics of the input data and the type of processing to be performed by the computing environment; read from the memory component input data; reorganize the read input data for writing to a cooperating neuron buffer according to the one or more processing parameters; write the reorganized data to one or more primary neuron buffer memory components of the neuron buffer; and copy the written data of the one or more primary neuron buffer memory components to one or more shadow neuron buffer memory components.

Example Clause Q, the computer-readable storage medium of Example Clause P, wherein the instructions further cause the one or more processors of the computing device to: select the one or more processing parameters for use in reorganizing the read input data from a set of processing parameters.

Example Clause R, the computer-readable storage medium of Example Clauses P and Q, wherein the instructions further cause the one or more processors of the computing device to: communicate the written data of the one or more shadow neuron buffer memory components to one or more cooperating neurons.

Example Clause S, the computer-readable storage medium of Example Clauses P through R, wherein the instructions further cause the one or more processors of the computing device to: perform a selected function comprising addition, multiplication, subtraction, division, or other arithmetic function on the data read from the one or more shadow neuron buffer memory components prior to communication to the one or more cooperating neurons.

Example Clause T, the computer-readable storage medium of Example Clauses P through S, wherein the instructions further cause the one or more processors of the computing device to: reorganize the read input data according to a selected stride value.

Example Clause U, the computer readable medium of Example Clauses P through T, wherein the memory component cooperates with a physical sensor capable of producing input data comprising audio data, video data, haptic sensory data, and other data for subsequent processing by the one or more cooperating processing units.

Example Clause V, the computer readable medium of Example Clauses P through U, wherein the cooperating processing units electronically cooperate with one or more output physical components operative to receive for human interaction processed input data comprising audio data, video data, haptic sensory data and other data.

Based on the foregoing, it should be appreciated that fabric bandwidth control resulting in enhanced processing performance and lower power consumption of a DNN module has been disclosed herein. Although the subject matter presented herein has been described in language specific to computer structural features, methodological and transformative acts, specific computing machinery, and computer readable media, it is to be understood that the subject matter set forth in the appended claims is not necessarily limited to the specific features, acts, or media described herein. Rather, the specific features, acts and mediums are disclosed as example forms of implementing the claimed subject matter.

The subject matter described above is provided by way of illustration only and should not be construed as limiting. Various modifications and changes can be made to the subject matter described herein without following the example configurations and applications illustrated and described, and without departing from the scope of the present disclosure, which is set forth in the following claims.

What is claimed is:

1. A system for enhanced data processing in an artificial intelligence/machine learning computing environment, the system comprising:
    at least one neural network processor;
    at least one memory component; and
    at least one memory in communication with the at least one neural network processor, the at least one memory having computer-readable instructions stored thereupon that, when executed by the at least one processor, cause the at least one processor to:
        receive one or more processing parameters from a cooperating component of the computing environment representative of characteristics of data processing comprising the characteristics of input data and the type of processing to be performed by the computing environment;
        read the input data from the memory component;
        reorganize the read input data for writing to a cooperating neuron buffer according to the one or more processing parameters during one or more data processing cycles of the artificial intelligence/machine learning computing environment;
        write the reorganized data to one or more primary neuron buffer memory components of the neuron buffer; and copy the written data of the one or more primary neuron buffer memory components to one or more shadow neuron buffer memory components.

2. The system of claim 1, wherein the computer readable instructions further cause the at least one processor to communicate the data copied to the one or more shadow neuron buffer memory components to one or more cooperating neurons for processing.

3. The system of claim 2, wherein the copy operation of the written data of the one or more primary neuron buffer memory components is performed after the memory of the one or more primary neuron buffer memory components is full during a data transaction processing cycle.

4. The system of claim 3, wherein the computer-readable instructions further cause the at least one processor to reorganize the data according to a selected stride value.

5. The system of claim 4, wherein the one or more primary neuron buffer memory components comprise a number of rows and columns, the number of columns proportional to a number of data cycles required to process the input data.

6. The system of claim 5, wherein the computer readable instructions further cause the at least one processor to process the one or more processing parameters by one or more other computing environment components to generate one or more instructions specific to the reorganization of the read input data.

7. The system of claim 6, wherein the reorganization of the data is calculated by the one or more other computing environment components to communicate data to every available one or more neurons during a data transaction cycle.

8. A computer-implemented method, comprising:
receiving one or more processing parameters from a cooperating component of a neural network environment representative of characteristics of data processing comprising the characteristics of the input data and the type of processing to be performed by the neural network environment;
reading input data from the memory component;
reorganizing the read input data for writing to a cooperating neuron buffer of the neural network environment according to the one or more processing parameters;
writing the reorganized data to one or more primary neuron buffer memory components of the neuron buffer;
copying the written data of the one or more primary neuron buffer memory components to one or more shadow neuron buffer memory components; and
communicating the data copied to the one or more shadow neuron buffer memory components to one or more cooperating neurons for processing.

9. The computer-implemented method of claim 8, further comprising reading data from the memory component for writing to a cooperating first primary neuron buffer memory component.

10. The computer-implemented method of claim 9, further comprising reading data from the memory component for writing to a cooperating second primary neuron buffer memory component.

11. The computer-implemented method of claim 10, further comprising copying the data written to the cooperating first primary neuron buffer memory to a cooperating first shadow neuron buffer memory component and copying the data written to the cooperating second primary neuron buffer memory component to a cooperating second shadow neuron buffer memory component.

12. The computer-implemented method of claim 11, further comprising performing a selected function on the data read from the cooperating first shadow neuron buffer memory component and data read from the cooperating second shadow neuron buffer memory component, such function comprising addition, multiplication, subtraction, and other arithmetic functions to generate function-applied data.

13. The computer-implemented method of claim 12, further communicating the function-applied data to one or more cooperating neurons for processing.

14. The computer-implemented method of claim 11, further comprising mapping the rows of the cooperating first primary neuron buffer memory component to a neuron of the one or more the cooperating neurons.

15. The computer-implemented method of claim 9, further comprising mapping the columns of the cooperating first primary neuron buffer memory component to a time variable representative of the clock cycles of the computing neural network environment.

16. A computer-readable storage medium having computer-executable instructions stored thereupon which, when executed by one or more processors of a computing device, cause the one or more processors of the computing device to:
receive one or more processing parameters from a cooperating component of a neural network environment representative of characteristics of data processing comprising the characteristics of input data and the type of processing to be performed by the neural network environment;
read input data from a memory component;
reorganize the read input data for writing to a cooperating neuron buffer according to the one or more processing parameters;
write the reorganized data to one or more primary neuron buffer memory components of the neuron buffer; and
copy the written data of the one or more primary neuron buffer memory components to one or more shadow neuron buffer memory components.

17. The computer-readable storage medium of claim 16, wherein the instructions further cause the one or more processors of the computing device to:
select the one or more processing parameters for use in reorganizing the read input data from a set of processing parameters.

18. The computer-readable storage medium of claim 17, wherein the instructions further cause the one or more processors of the computing device to:
communicate the written data of the one or more shadow neuron buffer memory components to one or more cooperating neurons.

19. The computer-readable storage medium of claim 18, wherein the instructions further cause the one or more processors of the computing device to:
perform a selected function comprising addition, multiplication, subtraction, division, or other arithmetic function on the data read from the one or more shadow neuron buffer memory components prior to communication to the one or more cooperating neurons.

20. The computer-readable storage medium of claim 16, wherein the instructions further cause the one or more processors of the computing device to:
reorganize the read input data according to a selected stride value.

21. The computer readable medium of claim 16, wherein the memory component cooperates with a physical sensor capable of producing input data comprising audio data, video data, haptic sensory data, and other data for subsequent processing by the one or more processors.

22. The computer readable medium of claim 21, wherein the cooperating processing units electronically cooperate with one or more output physical components operative to receive for human interaction processed input data comprising audio data, video data, haptic sensory data and other data.

\* \* \* \* \*